United States Patent
Imai et al.

(10) Patent No.: US 9,519,131 B2
(45) Date of Patent: Dec. 13, 2016

(54) ELECTRONIC DEVICE AND ELECTRONIC APPARATUS

(71) Applicant: Seiko Epson Corporation, Tokyo (JP)

(72) Inventors: Hideo Imai, Shimosuwa (JP); Yasushi Matsuno, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/556,733

(22) Filed: Dec. 1, 2014

(65) Prior Publication Data

US 2015/0153565 A1 Jun. 4, 2015

(30) Foreign Application Priority Data

Dec. 2, 2013 (JP) ................................ 2013-248930

(51) Int. Cl.
G02B 26/00 (2006.01)
G02B 7/00 (2006.01)
B81B 7/00 (2006.01)

(52) U.S. Cl.
CPC .......... *G02B 26/001* (2013.01); *B81B 7/0067* (2013.01); *G02B 7/006* (2013.01); *B81B 2201/042* (2013.01); *B81C 2203/0145* (2013.01)

(58) Field of Classification Search
CPC ... G02B 5/284; G02B 26/001; G02B 6/29358; G01J 3/26
See application file for complete search history.

(56) References Cited

U.S. PATENT DOCUMENTS

| | | | |
|---|---|---|---|
| 7,514,685 B2 | 4/2009 | Yoshida | |
| 7,902,481 B2 | 3/2011 | Kigawa et al. | |
| 8,013,993 B2 | 9/2011 | Shibayama et al. | |
| 8,018,591 B2 | 9/2011 | Shibayama et al. | |
| 8,027,034 B2 | 9/2011 | Shibayama et al. | |
| 8,035,814 B2 | 10/2011 | Shibayama et al. | |
| 8,040,507 B2 | 10/2011 | Shibayama | |
| 8,139,214 B2 | 3/2012 | Shibayama | |
| 8,564,773 B2 | 10/2013 | Shibayama et al. | |
| 8,604,412 B2 | 12/2013 | Shibayama et al. | |
| 8,742,320 B2 | 6/2014 | Shibayama et al. | |
| 8,804,118 B2 | 8/2014 | Shibayama et al. | |

(Continued)

FOREIGN PATENT DOCUMENTS

| | | |
|---|---|---|
| JP | 2005-317895 A | 11/2005 |
| JP | 2008-070163 A | 3/2008 |
| JP | 2013-092541 A | 5/2013 |
| JP | 2013-110492 A | 6/2013 |

*Primary Examiner* — Kimberly N Kakalec
(74) *Attorney, Agent, or Firm* — Harness, Dickey & Pierce, P.L.C.

(57) ABSTRACT

An electronic device includes a variable wavelength interference filter, and a package adapted to house the variable wavelength interference filter. The package includes a base substrate provided with a light passage hole through which light passes, and a base substrate side light transmissive substrate adapted to block the light passage hole and having a light transmissive property. The base substrate is formed of a laminated body having a plurality of layers stacked on each other, and the light passage hole is formed so that a second opening located on an opposite side to the variable wavelength interference filter is larger in area than a first opening located on the variable wavelength interference filter side.

9 Claims, 15 Drawing Sheets

(56) References Cited

U.S. PATENT DOCUMENTS

| | | | |
|---|---|---|---|
| 2003/0123125 A1* | 7/2003 | Little | B81C 99/008 359/290 |
| 2011/0116091 A1 | 5/2011 | Shibayama | |
| 2011/0141469 A1 | 6/2011 | Shibayama | |
| 2011/0146055 A1 | 6/2011 | Shibayama | |
| 2011/0157585 A1 | 6/2011 | Shibayama et al. | |
| 2012/0154915 A1* | 6/2012 | Hirokubo | G01J 3/26 359/578 |
| 2013/0208359 A1* | 8/2013 | Matsuno | G02B 5/284 359/578 |
| 2013/0278568 A1* | 10/2013 | Lasiter | H05K 1/0306 345/204 |
| 2014/0218802 A1* | 8/2014 | Saito | G01J 3/26 359/578 |

* cited by examiner

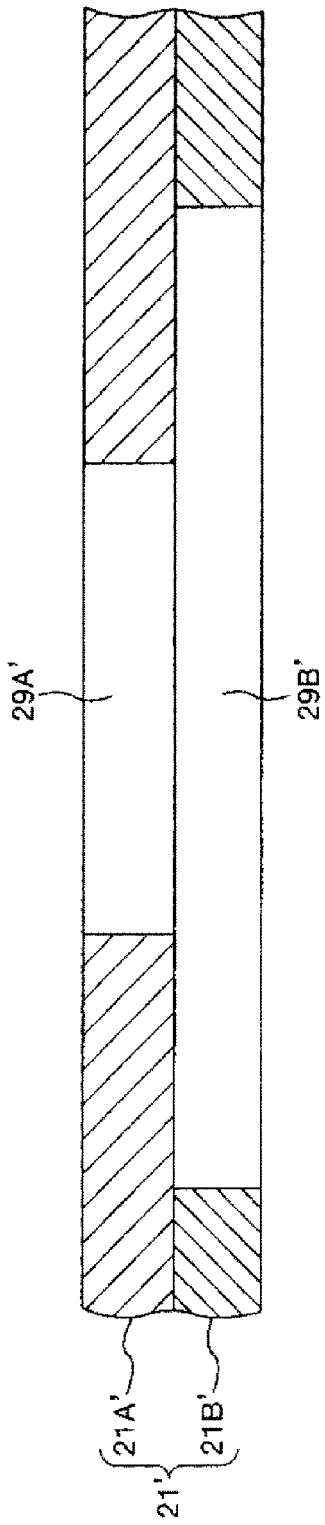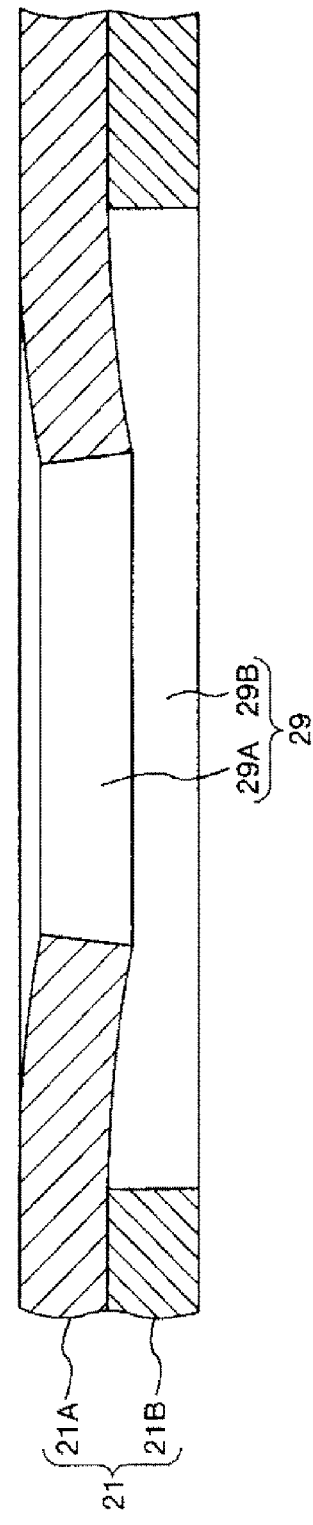
FIG. 7A
FIG. 7B

ELECTRONIC DEVICE AND ELECTRONIC APPARATUS

BACKGROUND

1. Technical Field

The present invention relates to an electronic device and an electronic apparatus.

2. Related Art

In the past, there has been known a variable wavelength interference filter having reflecting films respectively disposed on surfaces of a pair of substrates so as to be opposed to each other via a predetermined gap, the surfaces being opposed to each other. Further, there is known an optical filter device having such a variable wavelength interference filter housed in a housing (see, e.g., JP-A-2008-70163 (Document 1)).

The optical filter device described in Document 1 is provided with a package (a housing) having a plate-like pedestal (abase substrate) and a cylindrical cap. The housing has the peripheral edge portion of the base substrate and one end portion of the cylinder of the cap connected to each other by welding or bonding, and a space for housing the variable wavelength interference filter is disposed between the base substrate and the cap. Further, the cap is provided with a hole disposed on the upper surface opposed to the pedestal, and the hole is provided with a window section for allowing the light to pass therethrough.

Incidentally, as described in Document 1 mentioned above, there is a case in which the light passage hole is provided not only to the housing but also to the base substrate. However, in some cases, the parallelism of the base substrate is degraded due to the process for forming the light passage hole and so on. For example, warpage or projection occurs in the vicinity of the outer circumferential edge of the light passage hole. If the base substrate with the parallelism degraded and the variable wavelength interference filter are bonded to each other, since the warpage portion or the projection portion has local contact with the bonding surface of the variable wavelength interference filter, there is a problem that the variable wavelength interference filter fails to be fixed horizontally, and as a result, the resolution is degraded.

SUMMARY

An advantage of some aspects of the invention is to provide an electronic device and an electronic apparatus each having excellent characteristics.

Such an advantage as described above is achieved by the following aspects of the invention.

An electronic device according to an aspect of the invention includes a functional element, and a package adapted to house the functional element, the package includes a base substrate adapted to fix the functional element and provided with a light passage hole through which light passes, and a light transmissive substrate adapted to block the light passage hole and provided with a light transmissive property, the base substrate is formed of a laminated body having a plurality of layers stacked on each other, and the light passage hole is formed so that a second opening located on an opposite side to the functional element is larger in area than a first opening located on the functional element side.

Since the vicinity of the outer circumferential edge of the first opening of the base substrate is inhibited from warping toward the functional element by making the second opening larger in area than the first opening as described above, it is possible to mount (install) the functional element to the base substrate with accuracy. Therefore, the electronic device having excellent characteristics can be obtained.

In the electronic device according to the aspect of the invention, it is preferable that the light passage hole includes a first light passage hole, a second passage hole located nearer to the second opening than the first light passage hole, and larger than the first light passage hole, and a step section provided to a connection section between the first light passage hole and the second light passage hole.

According to this configuration, the light passage hole becomes to have a shape easily formed using the base substrate formed of the laminated body.

In the electronic device according to the aspect of the invention, it is preferable that the light transmissive substrate is located nearer to the second opening than the step section.

According to this configuration, the light transmissive substrate and the functional element can be prevented from having contact with each other.

In the electronic device according to the aspect of the invention, it is preferable that the light transmissive substrate is located inside the second light passage hole, and has an outer edge portion located outside the first light passage hole in a planar view of the base substrate.

According to this configuration, since the step section functions as a stopper for the light transmissive substrate, the positioning (the positioning in the thickness direction of the base substrate) of the light transmissive substrate to the base substrate can easily be performed.

In the electronic device according to the aspect of the invention, it is preferable that the light transmissive substrate is at least partially located inside the second light passage hole.

According to this configuration, the positioning of the light transmissive substrate to the base substrate (the positioning in the in-plane direction of the base substrate) can easily be performed.

In the electronic device according to the aspect of the invention, it is preferable that the light transmissive substrate is located between both principal surfaces of the base substrate in a cross-sectional view of the base substrate.

According to this configuration, since the light transmissive substrate can be prevented from projecting from the base substrate, a reduction in thickness of the package can be achieved.

In the electronic device according to the aspect of the invention, it is preferable that the light transmissive substrate is fixed to the base substrate via a bonding material provided to the step section.

According to this configuration, fixation of the light transmissive substrate to the base substrate can easily be performed.

In the electronic device according to the aspect of the invention, it is preferable that the bonding material is located outside the first light passage hole in a planar view of the base substrate.

According to this configuration, there is no chance for the bonding material to hinder the light guided to the functional element via the first light passage hole.

In the electronic device according to the aspect of the invention, it is preferable that the step section has a tip portion curved toward the second opening, and a thickness of the bonding material gradually decreases toward the tip portion of the step section.

According to this configuration, it is possible to effectively inhibit the bonding material from protruding to the inside of the first light passage hole.

In the electronic device according to the aspect of the invention, it is preferable that the base substrate has a sealing hole adapted to seal an internal space of the package adapted to house the functional element.

According to this configuration, the internal space can be maintained in a desired environment.

In the electronic device according to the aspect of the invention, it is preferable that the functional element is an optical interference filter including a first substrate, a second substrate opposed to the first substrate, a first reflecting film provided to the first substrate, and a second reflecting film provided to the second substrate and opposed to the first reflecting film via an inter-reflecting film gap, and having an optical interference region where the first reflecting film and the second reflecting film overlap each other, and the light passage hole is disposed corresponding to the optical interference region.

According to this configuration, the electronic device according to the aspect of the invention can be used as an optical filter device.

An electronic apparatus according to another aspect of the invention includes a functional element, and a package adapted to house the functional element, the package includes a base substrate adapted to fix the functional element and provided with alight passage hole through which light passes, and a light transmissive substrate adapted to block the light passage hole and provided with a light transmissive property, the base substrate is formed of a laminated body having a plurality of layers stacked on each other, and the light passage hole is formed so that a second opening located on an opposite side to the functional element is larger in area than a first opening located on the functional element side.

Since the vicinity of the outer circumferential edge of the first opening of the base substrate is inhibited from warping toward the functional element by making the second opening larger in area than the first opening as described above, it is possible to mount (install) the functional element to the base substrate with accuracy. Therefore, the electronic apparatus having excellent characteristics can be obtained.

BRIEF DESCRIPTION OF THE DRAWINGS

The invention will be described with reference to the accompanying drawings, wherein like numbers reference like elements.

FIGS. 7A and 7B are each a cross-sectional view for explaining a manufacturing method of the base substrate provided to the electronic device shown in FIG. 1.

DESCRIPTION OF EXEMPLARY EMBODIMENTS

Hereinafter, an electronic device and an electronic apparatus according to the invention will be explained in detail based on the embodiments shown in the accompanying drawings.

1. Electronic Device

First Embodiment

Figure 1:
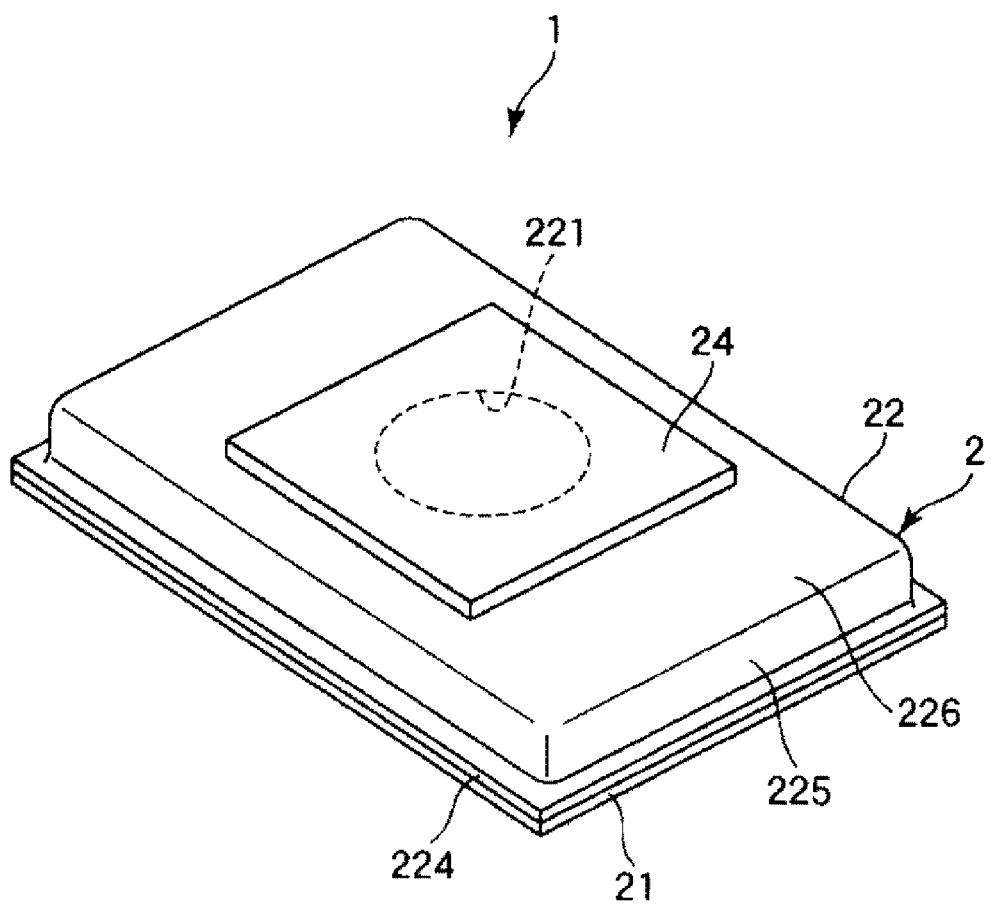
FIG. 1 is a perspective view showing an electronic device according to a first embodiment of the invention.
Figure 2:
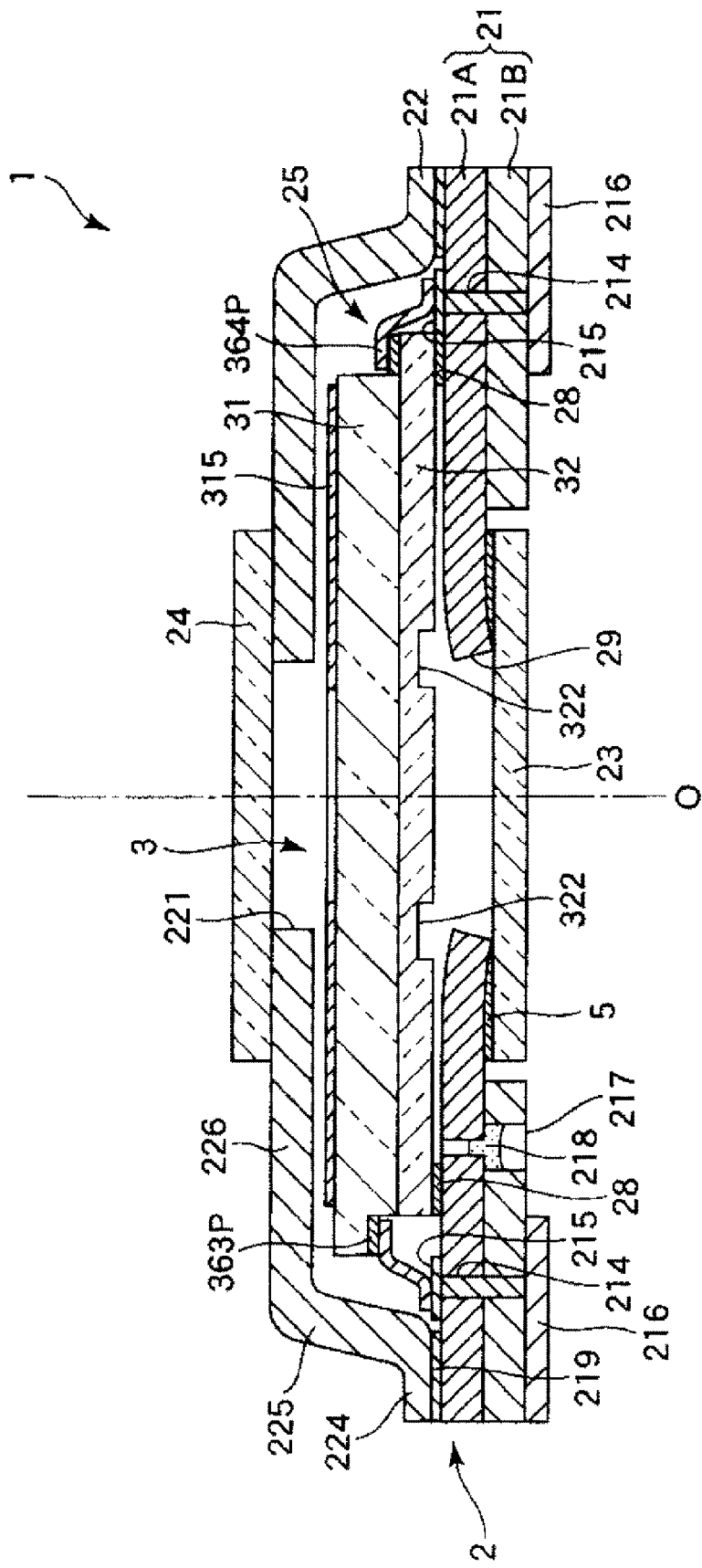
FIG. 2 is a cross-sectional view of the electronic device shown in FIG. 1.
Figure 3:
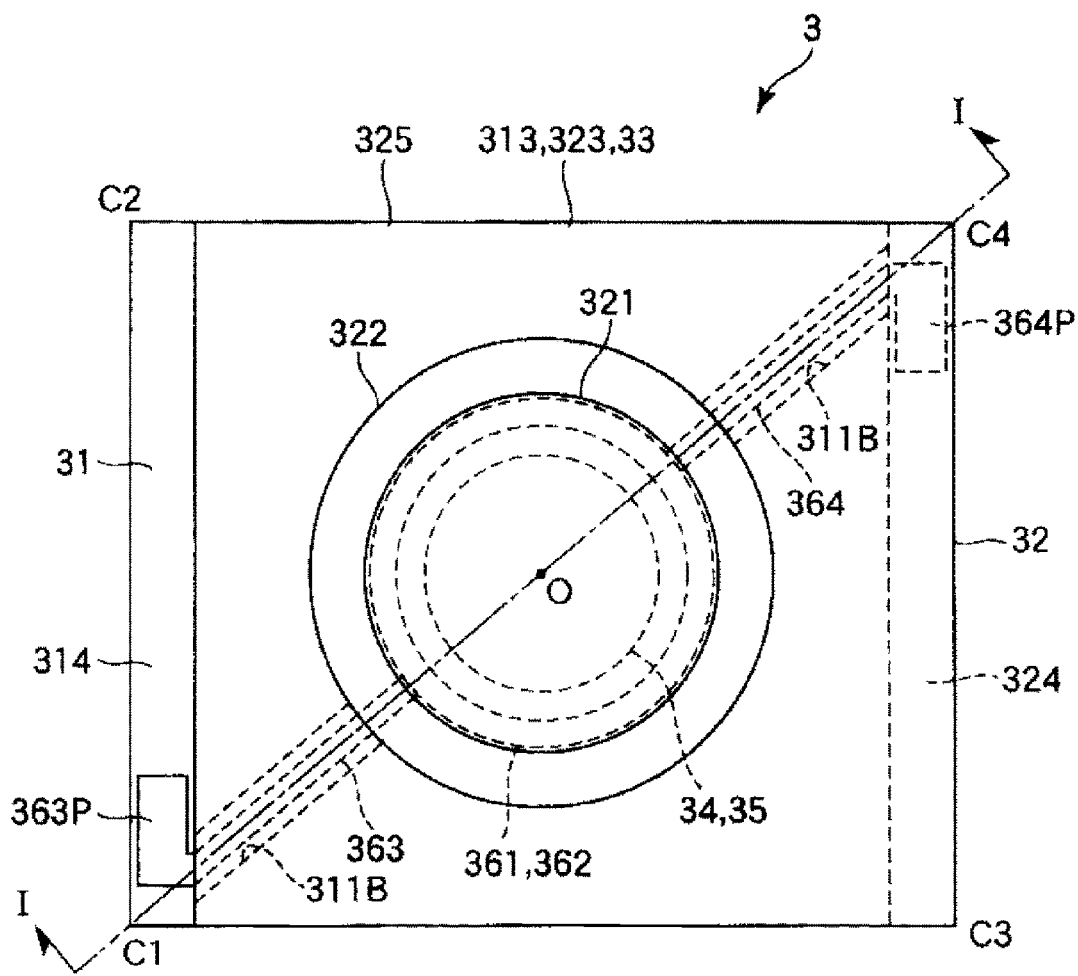
FIG. 3 is a plan view showing an interference filter provided to the electronic device shown in FIG. 1.
Figure 4:
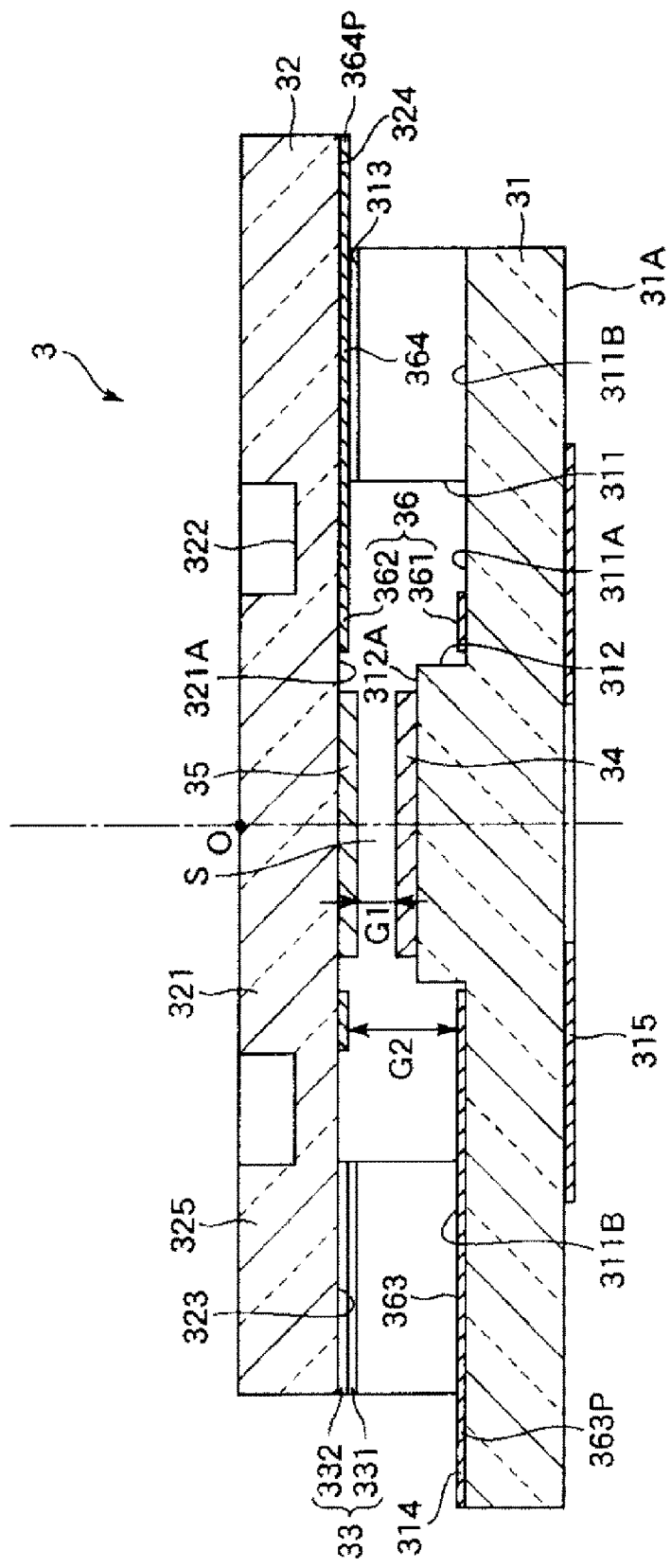
FIG. 4 is a cross-sectional view (a cross-sectional view along the I-I line shown in FIG. 3) of the interference filter shown in FIG. 3.
Figure 5A:
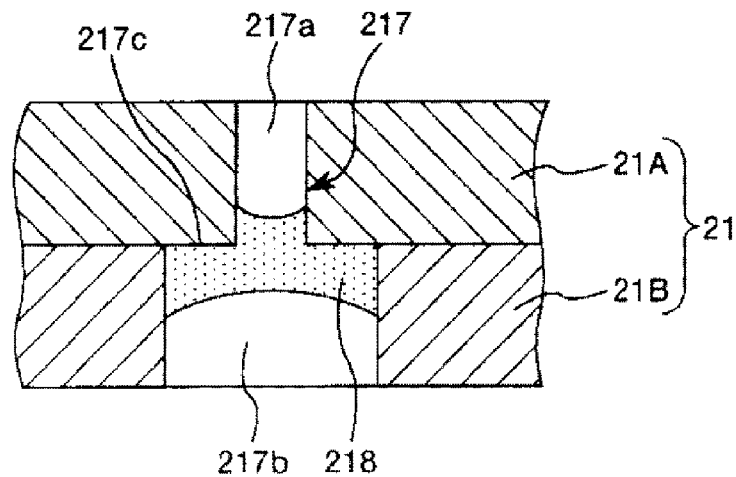
FIGS. 5A and 5B are each a partial enlarged cross-sectional view of the base substrate provided to the electronic device shown in FIG. 1.
Figure 5B:
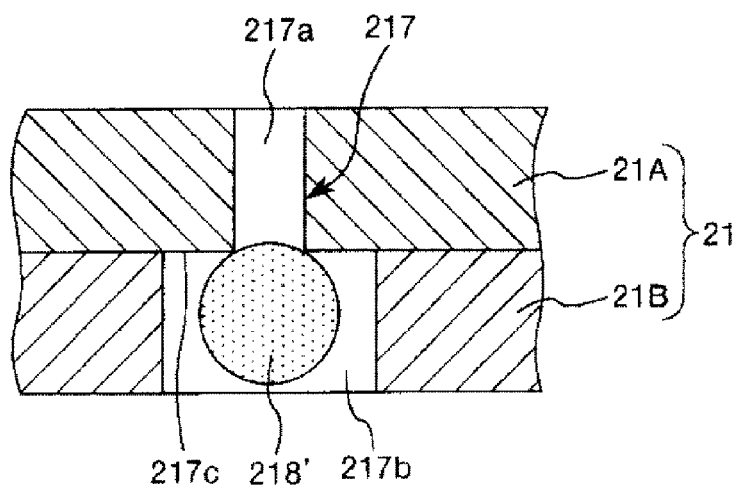
Figure 6:
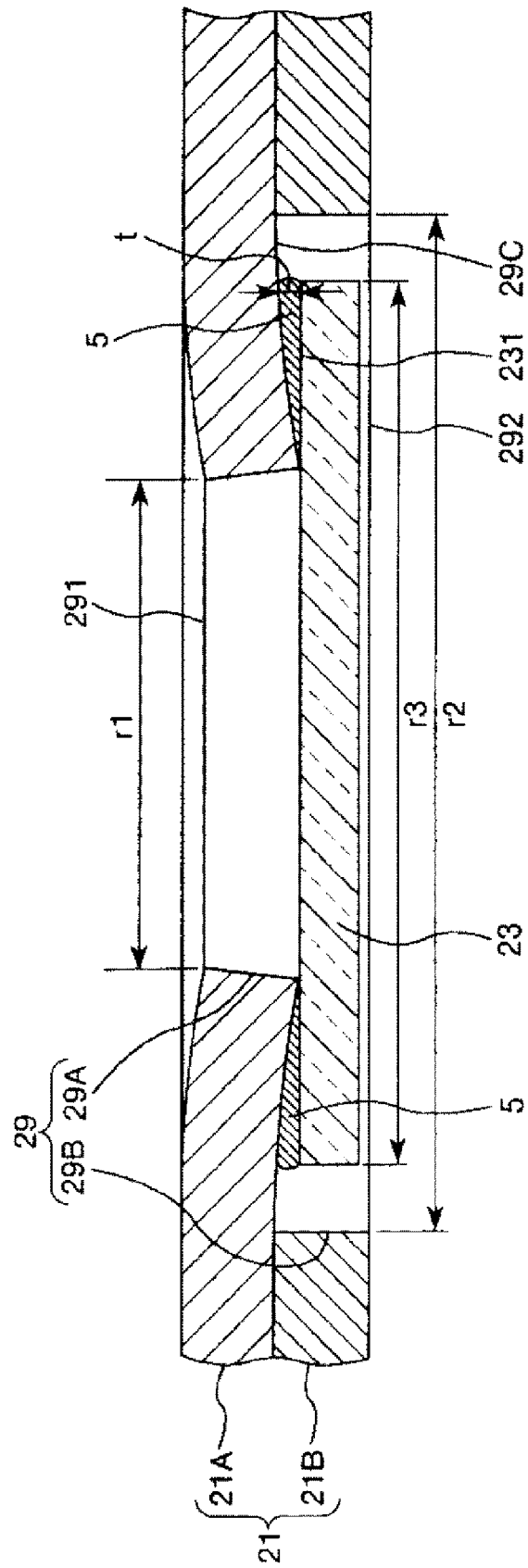
FIG. 6 is a partial enlarged cross-sectional view of the base substrate provided to the electronic device shown in FIG. 1.
Figure 8:
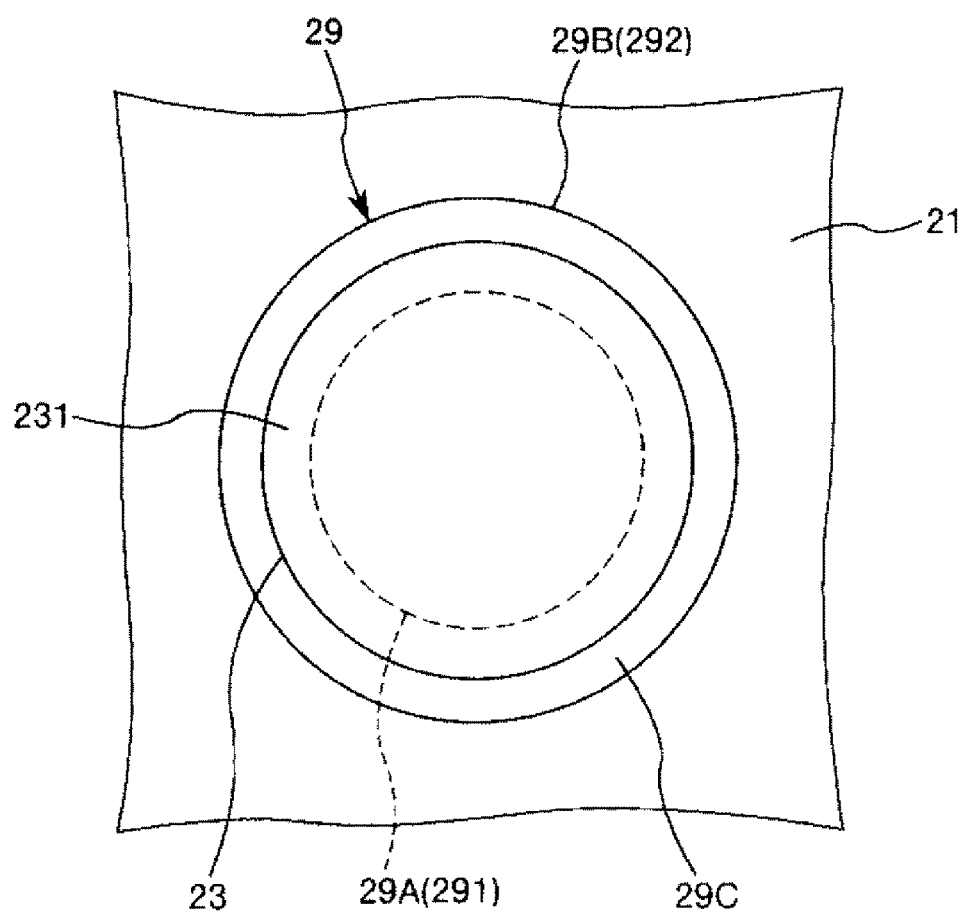
FIG. 8 is a plan view of the base substrate provided to the electronic device shown in FIG. 1.

FIG. 1 is a perspective view showing an electronic device according to a first embodiment of the invention. FIG. 2 is a cross-sectional view of the electronic device shown in FIG. 1. FIG. 3 is a plan view showing an interference filter provided to the electronic device shown in FIG. 1. FIG. 4 is a cross-sectional view (a cross-sectional view along the I-I line shown in FIG. 3) of the interference filter shown in FIG. 3. FIGS. 5A and 5B are each a partial enlarged cross-sectional view of the base substrate provided to the electronic device shown in FIG. 1. FIG. 6 is a partial enlarged cross-sectional view of the base substrate provided to the electronic device shown in FIG. 1. FIGS. 7A and 7B are each a cross-sectional view for explaining a manufacturing method of the base substrate provided to the electronic device shown in FIG. 1. FIG. 8 is a plan view of the base substrate provided to the electronic device shown in FIG. 1. It should be noted that the upper side of the sheets of FIGS. 2, 4, 5A, 5B, 6, 7A, and 7B is also referred to as an "upper side," and the lower side of the sheets is also referred to as a "lower side" in the following descriptions for the sake of convenience of explanation.

The electronic device 1 shown in FIG. 1 is a device used as an optical filter device.

The electronic device (an optical filter device) 1 is a device for taking out the light with a predetermined target wavelength from incident test target light and then emitting the light thus taken out, and is provided with a package 2 and a variable wavelength interference filter (a functional element) 3 housed in the package 2 as shown in FIGS. 1 and 2. Such an electronic device 1 can be incorporated in an optical module such as a colorimetric sensor, or an electronic apparatus such as a colorimetric device or a gas analyzing device.

Variable Wavelength Interference Filter

As shown in FIGS. 3 and 4, the variable wavelength interference filter 3 is an optical member having, for example, a rectangular plate shape, and is provided with a stationary substrate (a first substrate) 31 and a movable substrate (a second substrate) 32. The stationary substrate 31 and the movable substrate 32 are each made of, for example, a variety of types of glass such as soda glass, crystalline glass, quartz glass, lead glass, potassium glass, borosilicate glass, or alkali-free glass, or a quartz crystal.

Further, the stationary substrate 31 and the movable substrate 32 are configured integrally by bonding a first bonding section 313 of the stationary substrate 31 and a second bonding section 323 of the movable substrate 32 to each other with bonding films 33 (a first bonding film 331 and a second bonding film 332) each formed of, for example, a plasma-polymerized film consisting primarily of siloxane.

It should be noted that the plan view viewed from the thickness direction of the stationary substrate 31 or the movable substrate 32, namely the plan view of the variable wavelength interference filter 3 viewed from the stacking direction of the stationary substrate 31, the bonding films 33, and the movable substrate 32, is hereinafter referred to as a "filter planar view" for the sake of convenience of explanation.

The stationary substrate 31 is provided with a stationary reflecting film (a first reflecting film) 34, and the movable substrate 32 is provided with a movable reflecting film (a second reflecting film) 35. The stationary reflecting film 34 and the movable reflecting film 35 are disposed so as to be opposed to each other via an inter-reflecting film gap G1. It should be noted that an area where the stationary reflecting film 34 and the movable reflecting film 35 overlap each other is hereinafter referred to also as an "optical interference region S."

Further, the variable wavelength interference filter 3 is provided with an electrostatic actuator 36 used for controlling the length (dimension) of the inter-reflecting film gap G1. The electrostatic actuator 36 is constituted by a stationary electrode 361 provided to the stationary substrate 31 and a movable electrode 362 provided to the movable substrate 32. The stationary electrode 361 and the movable electrode 362 are opposed to each other via an inter-electrode gap G2 (G2>G1). Here, there can be adopted a configuration of disposing these electrodes 361, 362 directly on the surfaces of the stationary substrate 31 and the movable substrate 32, respectively, or a configuration of disposing these electrodes 361, 362 via other film members.

It should be noted that although in the present embodiment, the inter-reflecting film gap G1 is formed to be smaller than the inter-electrode gap G2, it is also possible to form the inter-reflecting film gap G1 to be longer than the inter-electrode gap G2 depending on the wavelength band in which the variable wavelength interference filter 3 transmits the light.

In the filter planar view, one side (e.g., the side located between the vertex C1 and the vertex C2 in FIG. 3) of the stationary substrate 31 projects to the outside of the movable substrate 32. In the projecting portion, a surface, which is exposed when viewing the variable wavelength interference filter 3 from the movable substrate 32 side, constitutes a first electrical component installation surface 314.

Further, in the filter plan view, one side (the side located between the vertex C3 and the vertex C4) opposed to the first electrical component installation surface 314 out of the sides of the movable substrate 32 projects to the outside of the stationary substrate 31. In the projecting portion, a surface, which is exposed when viewing the variable wavelength interference filter 3 from the stationary substrate side, constitutes a second electrical component installation surface 324.

The stationary substrate 31 is formed by processing a glass substrate formed to have a thickness of, for example, 500 μm. Specifically, as shown in FIG. 4, the stationary substrate 31 is provided with an electrode arrangement groove 311 and a reflecting film installation section 312 formed by etching. The stationary substrate 31 is formed to have a thickness dimension larger than that of the movable substrate 32, and no deflection of the stationary substrate 31 occurs due to the electrostatic attractive force when applying a voltage between the stationary electrode 361 and the movable electrode 362, or the internal stress of the stationary electrode 361.

The electrode arrangement groove 311 is formed to have a ring-like shape cantered on the center point O of the variable wavelength interference filter 3 in the filter planar view. The reflecting film installation section 312 is formed so as to protrude toward the movable substrate 32 from the central portion of the electrode arrangement groove 311 in the planar view described above. Here, the bottom surface of the electrode arrangement groove 311 forms an electrode installation surface 311A on which the stationary electrode 361 is disposed. Further, the projection tip surface of the reflecting film installation section 312 forms a reflecting film installation surface 312A.

Further, the stationary substrate 31 is provided with electrode extraction grooves 311B respectively extending from the electrode arrangement groove 311 toward the first electrical component installation surface 314 and the second electrical component installation surface 324.

The electrode installation surface 311A of the electrode arrangement groove 311 is provided with the stationary electrode 361. The stationary electrode 361 is disposed in an area of the electrode installation surface 311A, the area being opposed to the movable electrode 362 of a movable section 321 described later. Further, it is also possible to adopt a configuration in which an insulating film for ensuring an insulation property between the stationary electrode 361 and the movable electrode 362 is stacked on the stationary electrode 361.

Further, the stationary substrate 31 is provided with a stationary extraction electrode 363 extending from the outer peripheral edge of the stationary electrode 361 to the first electrical component installation surface 314 through the electrode extraction groove 311B. The extending tip portion (the part located at the vertex C1 of the stationary substrate 31) of the stationary extraction electrode 363 forms a stationary electrode pad 363P on the first electrical component installation surface 314.

It should be noted that although in the present embodiment, there is shown the configuration of providing the single stationary electrode 361 to the electrode installation surface 311A, it is also possible to adopt, for example, a configuration (a dual electrode configuration) in which two concentric electrodes centered on the center point O are disposed.

As described above, the reflecting film installation section 312 is formed to have a roughly columnar shape coaxial with the electrode arrangement groove 311 and having a diameter smaller than that of the electrode arrangement groove 311, and is provided with the reflecting film installation surface 312A of the reflecting film installation section 312 opposed to the movable substrate 32. Further, as shown in FIG. 4, the stationary reflecting film 34 is installed in the reflecting film installation section 312. As the stationary reflecting film 34, a metal film made of Ag or the like, or an alloy film made of an Ag alloy or the like, for example, can be used. Further, it is also possible to use, for example, a dielectric multilayer film with a high refractive index layer made of $TiO_2$, and a low refractive index layer made of $SiO_2$. Further, it is also possible to use a reflecting film obtained by stacking a metal film (or an alloy film) on a dielectric multilayer film, a reflecting film obtained by stacking a dielectric multilayer film on a metal film (or an alloy film), a reflecting film obtained by laminating a single refractive layer (made of, e.g., $TiO_2$ or $SiO_2$) and a metal film (or an alloy film) with each other, and so on.

Further, it is also possible to form an antireflection film on the light entrance surface 31A (the surface not provided with the stationary reflecting film 34) of the stationary substrate 31 at a position corresponding to the stationary reflecting film 34. The antireflection film can be formed by alternately stacking low refractive index films and high refractive index films, and decreases the reflectance of the visible light on the surface of the stationary substrate 31, while increasing the transmittance thereof.

Further, the light entrance surface 31A of the stationary substrate 31 is provided with a non-light transmissive member 315 made of Cr or the like. The non-light transmissive member 315 is formed to have a ring-like shape, and preferably, an annular shape. Further, the ring inside diameter of the non-light transmissive member 315 is set to the effective diameter of the optical interference region S. Thus, the non-light transmissive member 315 functions as an aperture for narrowing the incident light having entered the electronic device 1.

Further, a part of the surface of the stationary substrate 31, which is opposed to the movable substrate 32, and on which the electrode arrangement groove 311, the reflecting film installation section 312, or either one of the electrode extraction grooves 311B is not formed by etching, constitutes the first bonding section 313. The first bonding section 313 is provided with the first bonding film 331, and by bonding the first bonding film 331 to the second bonding film 332 provided to the movable substrate 32, the stationary substrate 31 and the movable substrate 32 are bonded to each other as described above.

The movable substrate 32 is formed by processing a glass substrate formed to have a thickness of, for example, 200 μm using, for example, an etching process. Specifically, the movable substrate 32 is provided with the movable section 321 having a circular shape centered on the center point O in the filter planar view shown in FIG. 3, a holding section 322 disposed outside the movable section 321 and for holding the movable section 321, and a substrate peripheral section 325 disposed outside the holding section 322.

The movable section 321 is formed to have a thickness dimension larger than that of the holding section 322, and is formed in the present embodiment, for example, to have the same thickness dimension as that of the movable substrate 32. The movable section 321 is formed to have a diameter dimension larger than at least the diameter dimension of the outer circumferential edge of the reflecting film installation surface 312A in the filter planar view. Further, the movable section 321 is provided with the movable electrode 362 and the movable reflecting film 35.

It should be noted that an antireflection film can also be formed on the opposite surface of the movable section 321 to the stationary substrate 31 similarly to the stationary substrate 31. Such an antireflection film can be formed by alternately stacking low refractive index films and high refractive index films, and is capable of decreasing the reflectance of the visible light on the surface of the movable substrate 32, and increasing the transmittance thereof.

The movable electrode 362 is opposed to the stationary electrode 361 via the inter-electrode gap G2, and is formed to have a ring-like shape, which is the same shape as that of the stationary electrode 361. Further, the movable substrate 32 is provided with a movable extraction electrode 364 extending from the outer peripheral edge of the movable electrode 362 toward the second electrical component installation surface 324. The extending tip portion (the part located at the vertex C4 of the movable substrate 32) of the movable extraction electrode 364 forms a movable electrode pad 364P on the second electrical component installation surface 324.

The movable reflecting film 35 is disposed in the central portion of a movable surface 321A of the movable section 321 so as to be opposed to the stationary reflecting film 34 via the inter-reflecting film gap G1. As the movable reflecting film 35, there is used a reflecting film having the same configuration as that of the stationary reflecting film 34 described above.

The holding section 322 is a diaphragm surrounding the periphery of the movable section 321, and is formed to have a ring-like shape in the filter planar view. The holding section 322 is formed to have a thickness dimension smaller than that of the movable section 321. Further, the holding section 322 is formed at a position opposed to the outer circumferential edge of a light passage hole 29 of the base substrate 21 described later.

Such a holding section 322 is easier to be deflected than the movable section 321, and it becomes possible to displace the movable section 321 toward the stationary substrate 31 with a weak electrostatic attractive force. On this occasion, since the movable section 321 has a larger thickness dimension and higher rigidity than those of the holding section 322, the shape variation of the movable section 321 does not occur even in the case in which the holding section 322 is pulled toward the stationary substrate 31 due to the electrostatic attractive force. Therefore, deflection of the movable reflecting film 35 provided to the movable section 321 does not occur, and it becomes possible to always keep the stationary reflecting film 34 and the movable reflecting film 35 in a parallel state.

As described above, the substrate peripheral section 325 is disposed outside the holding section 322 in the filter planar view. The surface of the substrate peripheral section 325 opposed to the stationary substrate 31 is provided with the second bonding section 323 opposed to the first bonding section 313. Further, the second bonding section 323 is provided with the second bonding film 332, and as described above, by bonding the second bonding film 332 to the first bonding film 331, the stationary substrate 31 and the movable substrate 32 are bonded to each other.

Although the configuration of the variable wavelength interference filter 3 is explained hereinabove, the configuration of the variable wavelength interference filter 3 is not limited to the configuration described above providing substantially the same advantage can be obtained.

Package

As shown in FIGS. 1 and 2, the package 2 is provided with the base substrate 21, the lid 22 bonded to the base substrate 21, a base substrate side light transmissive substrate (a light transmissive substrate) 23 provided to the base substrate 21, and a lid side light transmissive substrate 24 provided to the lid 22. Hereinafter, these members will sequentially be explained.

Base Substrate

The base substrate 21 is formed of, for example, a multilayer ceramic substrate having a plurality of ceramic substrates (layers) stacked on each other. As shown in FIG. 2, the base substrate 21 of the present embodiment is formed of a multilayer ceramic substrate having a second ceramic substrate 21B located on the lower side (on the opposite side to the variable wavelength interference filter 3) and a first ceramic substrate 21A stacked on the upper side of the second ceramic substrate 21B. It should be noted that the number of ceramic substrates (layers) included in the multilayer ceramic substrate is not limited to two, but can also be equal to or larger than three.

The upper surface of such a base substrate 21 forms a mounting surface for mounting the variable wavelength interference filter 3, and in the present embodiment, the movable substrate 32 of the variable wavelength interference filter 3 is disposed on the upper surface of the base substrate 21. The movable substrate 32 is disposed on the base substrate 21 via a bonding layer 28. It should be noted that the movable substrate 32 can also be disposed on the base substrate 21 by being fitted in another fixation member and so on.

Further, on the upper surface of the base substrate 21, there is disposed an internal terminal sections 215 to be electrically connected to the respective electrode pads 363P, 364P of the variable wavelength interference filter 3. The connection between the respective electrode pads 363P, 364P and the internal terminal sections 215 is not particularly limited, but can be achieved by, for example, Ag paste, an anisotropic conductive film (ACF), or anisotropic conductive paste (ACP). Among these materials, the Ag paste with little degassing (gas emission) is preferably used from the viewpoint of keeping the internal space 25 of the package 2 in the vacuum state. It should be noted that the respective electrode pads 363P, 364P and the internal terminal sections 215 can also be connected to each other using, for example, wire bonding besides the methods described above.

Further, the base substrate 21 is provided with through electrodes 214 formed so as to correspond to the positions where the respective internal terminal sections 215 are disposed, and the internal terminal sections 215 are respectively connected to external terminal sections 216 disposed on the lower surface of the base substrate 21 via the through electrodes 214.

Further, the base substrate 21 is provided with a sealing hole 217 for communicating the inside and the outside of the package 2, and the sealing hole 217 is sealed with a sealing member 218 formed of, for example, an Au—Ge type metal material. By disposing such a sealing hole 217, it is possible to set the internal space 25 to a desired environment. Specifically, by first removing the gas in the internal space 25 via the sealing hole 217 to set the internal space to a vacuum state, and then sealing the sealing hole 217 with the sealing member 218 while keeping the vacuum state, the internal space 25 can be kept in the vacuum state. In particular in the present embodiment, as shown in FIG. 5A, an upper side portion (a part formed in the first ceramic substrate 21A) 217a of the sealing hole 217 is shrunk in diameter with respect to a lower side portion (a part formed in the second ceramic substrate 21B) 217b, and a step portion 217c constituted by the lower surface of the first ceramic substrate 21A is formed on the boundary between these portions. Therefore, as shown in FIG. 5B, by preparing a metal ball 218' larger in diameter than the upper side portion 217a, inserting the metal ball 218' in the lower side portion 217b of the sealing hole 217 so as to be stopped by the step portion 217c, and then melting the metal ball 218' with laser irradiation or the like, the sealing hole 217 can easily be sealed with the sealing member 218.

Further, the base substrate 21 is provided with the light passage hole 29, which penetrates the base substrate 21 in the thickness direction of the base substrate 21, formed in an area opposed to the optical interference region S of the variable wavelength interference filter 3. It should be noted that the cross-sectional shape (an opening shape) of the light passage hole 29 is not particularly limited, but can also be a circular shape, an elliptical shape, a triangular shape, a rectangular shape, and so on. In the present embodiment, the light passage hole 29 has a circular cross-sectional shape. Thus, the formation of the light passage hole 29 becomes easy, and further, the stress concentration into the vicinity of the outer circumferential edge of the light passage hole 29 and so on can be reduced.

In the further detailed explanation of the light passage hole 29, as shown in FIG. 6, the light passage hole 29 is formed so that the diameter r2 (the area) of a second opening 292 located on the lower side (on the opposite side to the variable wavelength interference filter 3) is larger than the diameter r1 (the area) of a first opening 291 located on the upper side (on the variable wavelength interference filter 3 side). Such alight passage hole 29 has a first light passage hole 29A penetrating the first ceramic substrate 21A, and a second light passage hole 29B penetrating the second ceramic substrate 21B, and the upper opening of the first light passage hole 29A constitutes the first opening 291, and the lower opening of the second light passage hole 29B constitutes the second opening 292.

Further, the first and second light passage holes 29A, 29B each have a cylindrical shape constant in diameter in the axial direction, and are formed concentrically so as to have the center axes coinciding with each other. Further, the diameter r2 of the second light passage hole 29B is larger than the diameter r1 of the first light passage hole 29A, and therefore, a step section 29C constituted by the lower surface of the first ceramic substrate 21A is formed in the connection section (midway in the light passage hole 29) between the first light passage hole 29A and the second light passage hole 29B. In other words, when viewing the base substrate 21 from the underside, the vicinity of the outer circumferential edge of the first light passage hole 29A of the lower surface of the first ceramic substrate 21A is exposed inside the second light passage hole 29B, and the portion thus exposed forms the step section 29C.

By adopting the configuration of disposing the step section midway in the light passage hole 29 in order to fulfill the relationship of r1<r2 as described above, the base substrate 21 having the light passage hole 29 can easily be manufactured. In the specific explanation, for example, firstly, as shown in FIG. 7A, a green sheet 21A' provided with a through hole 29A' to form the first light passage hole 29A and a green sheet 21B' provided with a through hole 29B' to form the second light passage hole 29B are prepared, and a laminated body 21' is obtained by stacking these green sheets 21A', 21B' on each other. It should be noted that the through holes 29A', 29B' can each be formed by punching, laser processing, and so on. Then, as shown in FIG. 7B, by calcining the laminated body 21', the base substrate 21 having the light passage hole 29 can be manufactured.

Here, the laminated body 21' contracts when being calcined. In the related art, it is difficult to control the warpage generated in the vicinity of the outer circumferential edge of the light passage hole 29 due to the contraction. In contrast, in the base substrate 21, since the diameter of the through hole 29B' is made larger than the diameter of the through hole 29A' to arrange that a portion in the vicinity of the outer circumferential edge of the first light passage hole 29A of the first ceramic substrate 21A is pulled toward the second ceramic substrate 21B, the shape having a curvature deformation of the vicinity of the outer circumferential edge of the first light passage hole 29A of the first ceramic substrate 21A toward the second ceramic substrate 21B as shown in FIG. 6 can almost certainly be obtained. As described above, in the base substrate 21, the direction of the warpage of the vicinity of the outer circumferential edge of the light passage hole 29 can be controlled, and thus, it is possible to prevent the vicinity of the outer circumferential edge of the light passage hole 29 from warping toward the variable wavelength interference filter 3. Therefore, the contact between the warping portion and the variable wavelength interference filter 3 and so on can be prevented, and the variable wavelength interference filter 3 can be fixed to the base substrate 21 with high accuracy (high parallelism), and as a result, the resolution of the electronic device 1 can be prevented from degrading.

Base Substrate Side Light Transmissive Substrate

The base substrate side light transmissive substrate 23 seals the light passage hole 29. It should be noted that the base substrate side light transmissive substrate 23 has a light transmissive property, and it is arranged that the light can pass through the light passage hole 29. Such a base substrate side light transmissive substrate 23 is not particularly limited providing the light transmissive property is provided, and a glass substrate and a resin substrate, for example, can be used, and further, in the case in which the light used is an infrared ray, a silicon substrate can also be used. It should be noted that among these substrates, the glass substrate is preferably used as the base substrate side light transmissive substrate 23 from the viewpoint that the glass substrate has a high light transmissive property, and high parallelism.

Further, the base substrate side light transmissive substrate 23 has a circular planar shape (i.e., a planar shape corresponding to the light passage hole 29), and is arranged to have a diameter r3 longer than the diameter r1 of the first light passage hole 29A and shorter than the diameter r2 of the second light passage hole 29B. Further, the base substrate side light transmissive substrate 23 is inserted into the light passage hole 29 through the second opening 292, and is disposed so as to be stopped in an outer edge portion 231 by the step section 29C located inside the light passage hole 29. In other words, as shown in FIG. 8, in the planar view of the base substrate 21 viewed from the underside, the base substrate side light transmissive substrate 23 is located inside the second light passage hole 29B, and at the same time, the outer edge portion 231 of the base substrate side light transmissive substrate 23 is located outside the first light passage hole 29A.

As described above, by inserting the base substrate side light transmissive substrate 23 into the second light passage hole 29B so as to be stopped by the step section 29C, positioning of the base substrate side light transmissive substrate 23 can be performed with accuracy. In other words, by making the base substrate side light transmissive substrate 23 be stopped by the step section 29C, the positioning of the base substrate side light transmissive substrate 23 with respect to the thickness direction of the base substrate 21 can be achieved. In contrast, by inserting the base substrate side light transmissive substrate 23 into the second light passage hole 29B, positioning of the base substrate side light transmissive substrate 23 with respect to the in-plane direction of the base substrate 21 can be achieved. In addition, since the base substrate side light transmissive substrate 23 is located downward (on the second opening 292 side) from the step section 29C, there is no chance for the base substrate side light transmissive substrate 23 to project upward from the upper surface of the base substrate 21. Therefore, it is possible to prevent the base substrate side light transmissive substrate 23 and the variable wavelength interference filter 3 from having contact with each other.

Further, as shown in FIG. 6, the base substrate side light transmissive substrate 23 is thinner than the thickness of the second ceramic substrate 21B, and the entire area of the base substrate side light transmissive substrate 23 is located inside the second light passage hole 29B. In other words, in the cross-sectional view of the base substrate 21, the base substrate side light transmissive substrate 23 is located between both principal surfaces (the upper surface and the lower surface) of the base substrate 21. Therefore, the base substrate side light transmissive substrate 23 does not project from the lower surface of the base substrate 21, and accordingly, the reduction in size (reduction in height) of the package 2 can be achieved. It should be noted that the arrangement of the base substrate side light transmissive substrate 23 is not limited to the above, but it is also possible for the base substrate side light transmissive substrate 23 to partially project from the lower surface of the base substrate 21.

Such a base substrate side light transmissive substrate 23 is fixed to the base substrate 21 via a bonding material 5 such as an adhesive throughout the entire circumference of the outer edge portion 231. The bonding material 5 intervenes between the step section 29C and the outer edge portion 231 of the base substrate side light transmissive substrate 23, and thus, the base substrate side light transmissive substrate 23 is airtightly bonded to the light passage hole 29. As described above, by using the bonding material 5, the base substrate side light transmissive substrate 23 and the base substrate 21 can easily be bonded to each other. It should be noted that the bonding material 5 is not particularly limited providing the bonding material 5 can bond the base substrate side light transmissive substrate 23 and the base substrate 21 to each other, and a variety of bonding materials such as an epoxy-based material or an acrylic material, low-melting-point glass, and so on can be used.

In particular in the present embodiment, the bonding material 5 is located outside the first light passage hole 29A in the planar view of the base substrate 21, and does not enter the inside of the first light passage hole 29A. Therefore, there is no chance for the bonding material 5 to interfere the light passing through the inside of the light passage hole 29, and it is possible to prevent the resolution of the electronic device 1 from degrading. Here, as described above, since there is provided the shape having the downward curvature deformation of the vicinity of the outer circumferential edge of the first light passage hole 29A of the base substrate 21, the bonding material 5 gradually decreases in thickness "t" toward the center of the light passage hole 29 (i.e., toward the tip of the step section 29C). Therefore, since the amount of the bonding material 5 decreases toward the first light passage hole 29A, the bonding material 5 can effectively be prevented from entering the inside of the first light passage hole 29A in the planar view of the base substrate 21. In particular in the present embodiment, the tip of the step section 29C and the upper surface of the base substrate side light transmissive substrate 23 have contact with each other, and thus, the contact section functions as a stopper for the bonding material 5. Therefore, the bonding material 5 can more effectively be prevented from entering the inside of the first light passage hole 29A.

It should be noted that although in the present embodiment, there is adopted the configuration in which the bonding material 5 intervenes only between the step section 29C and the upper surface of the base substrate side light transmissive substrate 23, the arrangement of the bonding material 5 is not limited to this configuration, but it is also possible for the bonding material 5 to be further disposed straddling also the side surface of the base substrate side light transmissive substrate 23 to form a fillet shape, for example. Thus, the contact area between the base substrate 21 and the base substrate side light transmissive substrate 23 is enlarged, and the bonding strength can accordingly be enhanced.

Lid

As shown in FIG. 2, the lid 22 is provided with a lid bonding section 224 located on the outer circumferential edge of the lid 22, a sidewall section 225 continuous from the lid bonding section 224 and rising in the direction of getting away from the base substrate 21, and a top surface section 226 continuous from the sidewall section 225 and covering the stationary substrate 31 side of the variable wavelength interference filter 3. Such a lid 22 can be formed of an alloy such as kovar, or metal.

Further, the lid 22 is bonded tightly to the base substrate 21 via a base bonding section 219 formed on the outer circumferential portion of the base substrate 21. As the bonding method, there can be cited, for example, soldering with brazing silver or the like, sealing with a eutectic alloy layer, welding with low-melting-point glass, glass adhesion, glass frit bonding, and adhesion with epoxy resin, besides laser welding. It should be noted that these bonding methods can arbitrarily be selected in accordance with the materials of the base substrate 21 and the lid 22, the bonding environment, and so on.

The top surface section 226 is parallel to the base substrate 21. The top surface section 226 is provided with a light passage hole 221 formed so as to open in an area opposed to the optical interference region S of the variable wavelength interference filter 3. Here, in the present embodiment, the light enters the light passage hole 221 of the lid 22, and the light taken out by the variable wavelength interference filter 3 is emitted from the light passage hole 29 of the base substrate 21. In such a configuration as described above, out of the light having entered the light passage hole 221, only the light corresponding to the effective diameter of the non-light transmissive member 315 provided to the light entrance surface 31A of the variable wavelength interference filter 3 enters the stationary reflecting film 34 and the movable reflecting film 35.

In particular, the shapes of the substrates 31, 32 of the variable wavelength interference filter 3 are formed by etching, and a curved part is formed in the etched part due to the influence of the side etching. If the light enters such a curved part, the light might be emitted from the light passage hole 29 as stray light in some cases. In contrast, in the present embodiment, such stray light can be prevented from occurring by the non-light transmissive member 315, and it becomes possible to take out the light with the desired wavelength.

Lid Side Light Transmissive Substrate

The lid side light transmissive substrate 24 seals the light passage hole 221. It should be noted that the lid side light transmissive substrate 24 has a light transmissive property, and therefore, the light can pass through the light passage hole 221. Such a lid side light transmissive substrate 24 is not particularly limited providing the lid side light transmissive substrate 24 has a light transmissive property, and it is possible to adopt, for example, substantially the same configuration as the base substrate side light transmissive substrate 23.

The method of bonding the lid 22 and the lid side light transmissive substrate 24 to each other is not particularly limited, and there can be used, for example, glass frit bonding using a glass frit, which is a scrap of glass obtained by melting glass material at high temperature and then rapidly cooling the glass material. In such glass frit bonding, no gap occurs in the bonded area, and it is possible to keep the internal space 25 in the vacuum state by using the glass frit with little degassing (gas emission). It should be noted that the bonding method is not limited to the glass frit bonding, but the bonding method such as welding using the low-melting-point glass or glass sealing can also be adopted. Further, bonding using an epoxy resin adhesive can also be adopted.

Second Embodiment

Figure 9:
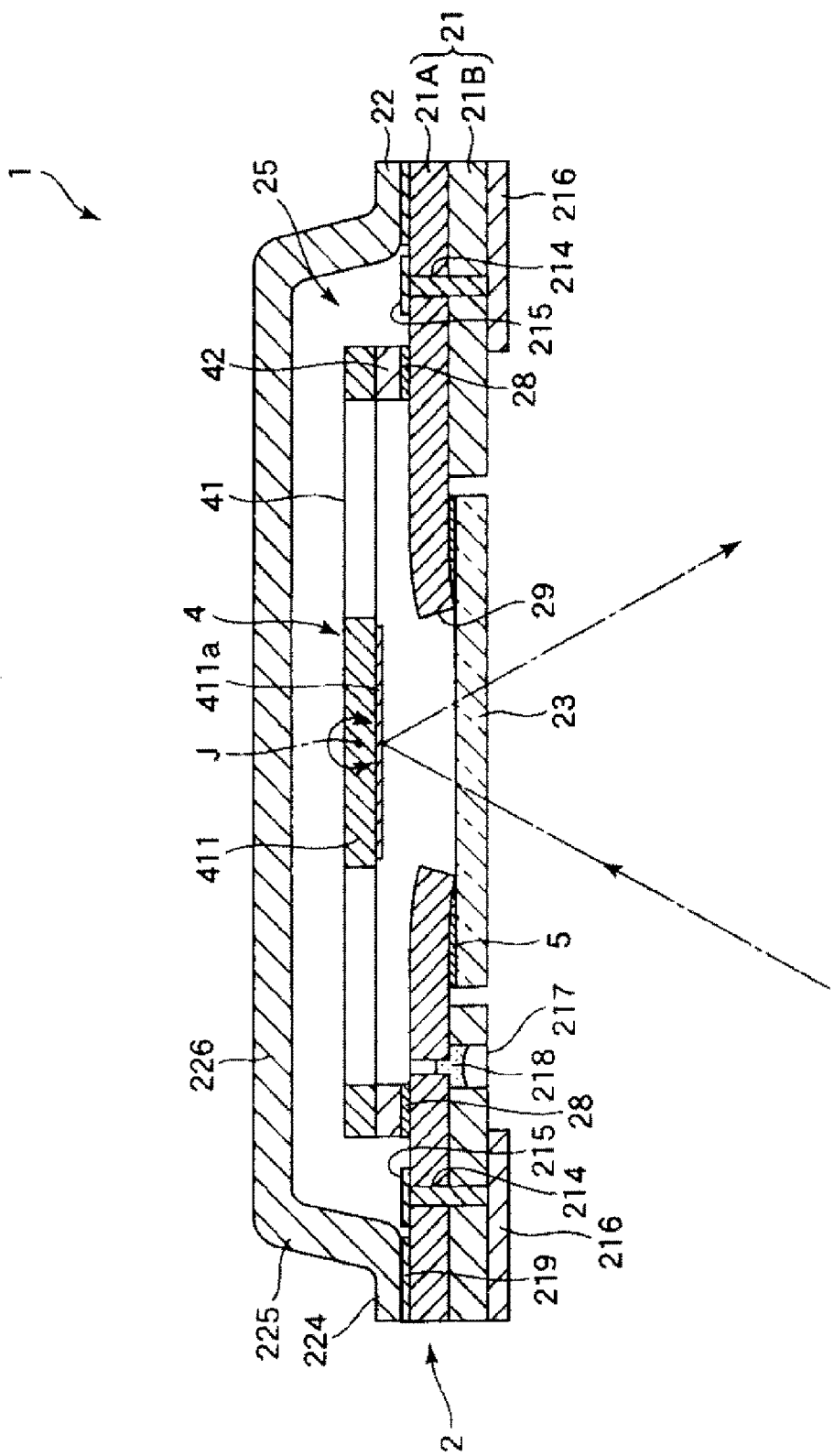
FIG. 9 is a cross-sectional view showing an electronic device according to a second embodiment of the invention.
Figure 10:
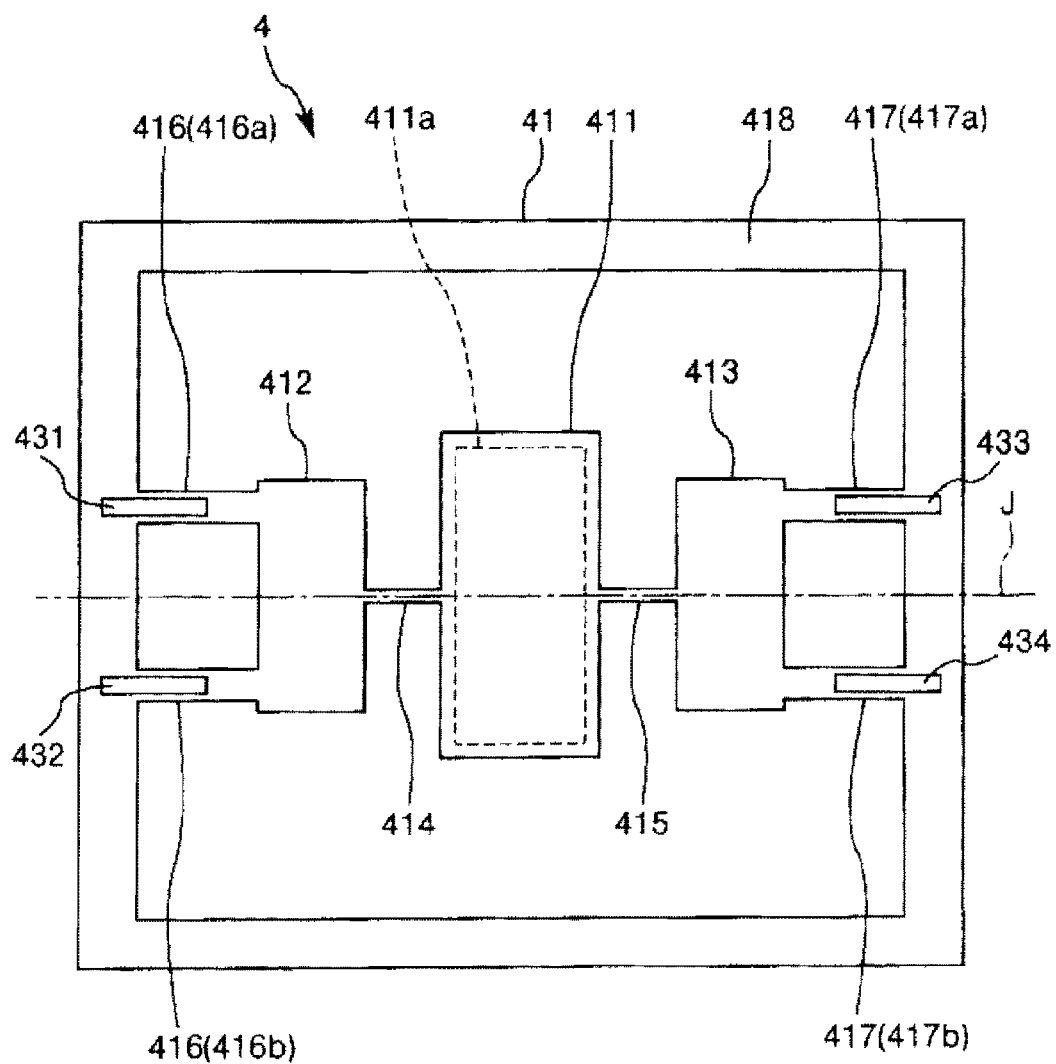
FIG. 10 is a plan view showing an optical scanner provided to the electronic device shown in FIG. 9.

FIG. 9 is a cross-sectional view showing an electronic device according to a second embodiment of the invention. FIG. 10 is a plan view showing an optical scanner provided to the electronic device shown in FIG. 9.

Hereinafter, the electronic device according to the second embodiment will be described mainly focused on the differences from the embodiment described above, and the explanation of substantially the same matters will be omitted.

The electronic device according to the second embodiment is substantially the same as the electronic device according to the first embodiment described above except mainly the point that the configuration of the functional element is different. It should be noted that in FIG. 9, the constituents substantially identical to those of the embodiment described above are denoted with the same reference symbols.

The electronic device 1 according to the present embodiment is a device used as an optical scanner device.

The electronic device (the optical scanner device) 1 is a device for making a scanning movement with the incident light (a laser beam), and is provided with the package 2, and the optical scanner (the functional element) 4 housed inside the package 2 as shown in FIG. 9. Such an electronic device 1 can be incorporated in the electronic apparatus such as a projector, a head-mounted display, or a head-up display.

Optical Scanner

As shown in FIGS. 9 and 10, the optical scanner 4 has a base body 41 having a vibration system, a support substrate (a spacer) 42 for supporting the base body 41, and piezoelectric elements 431, 432, 433, and 434 for driving the vibration system of the base body 41. Further, the support substrate 42 is disposed on the base substrate 21 via a bonding layer 28.

As shown in FIG. 10, the base body 41 includes a movable plate 411, drive plates 412, 413 located on both sides of the movable plate 411, a support section 418 having a frame shape and disposed so as to surround the movable plate 411 and the drive plates 412, 413, shaft sections 414, 415 for connecting the movable plate 411 and the drive plates 412, 413, and shaft sections 416, 417 for connecting the drive plates 412, 413 and the support section 418. Further, the shaft sections 416, 417 are each disposed as a pair of members across a rotational axis J. Further, the piezoelectric element 431 is disposed straddling the boundary between one (416a) of the shaft sections 416 and the support section 418, the piezoelectric element 432 is disposed straddling the boundary between the other (416b) of the shaft sections 416 and the support section 418, the piezoelectric element 433 is disposed straddling the boundary between one (417a) of the shaft sections 417 and the support section 418, and the piezoelectric element 434 is disposed straddling the boundary between the other (417b) of the shaft sections 417 and the support section 418.

In the optical scanner 4 having such a configuration, by contracting each of the piezoelectric elements 431 through 434 by applying the electric power, it is possible to swing (rotate) the movable plate 411 around the rotational axis J. On the lower surface of the movable plate 411, there is disposed a light reflecting film 411a formed of, for example, an aluminum thin film, and a scanning movement of the light, which has entered the light reflecting film 411a via the light passage hole 29, can be made via the light passage hole 29.

Package

The package 2 has substantially the same configuration as the package 2 in the first embodiment described above except the point that the light passage hole 221 of the lid 22 and the lid sidelight transmissive substrate 24 are omitted. Therefore, the explanation of the package 2 will be omitted.

According to such an electronic device 1 as described above, the warping portion of the base substrate 21 and the optical scanner 4 can be prevented from having contact with each other, the optical scanner 4 can be fixed to the base substrate 21 with high accuracy, and as a result, an optical scanning property of the electronic device 1 can be prevented from degrading.

2. Electronic Apparatus

Then, the electronic apparatus incorporating the electronic device (the optical filter device) 1 according to the first embodiment described above will be explained.

Colorimetric Device

Figure 11:
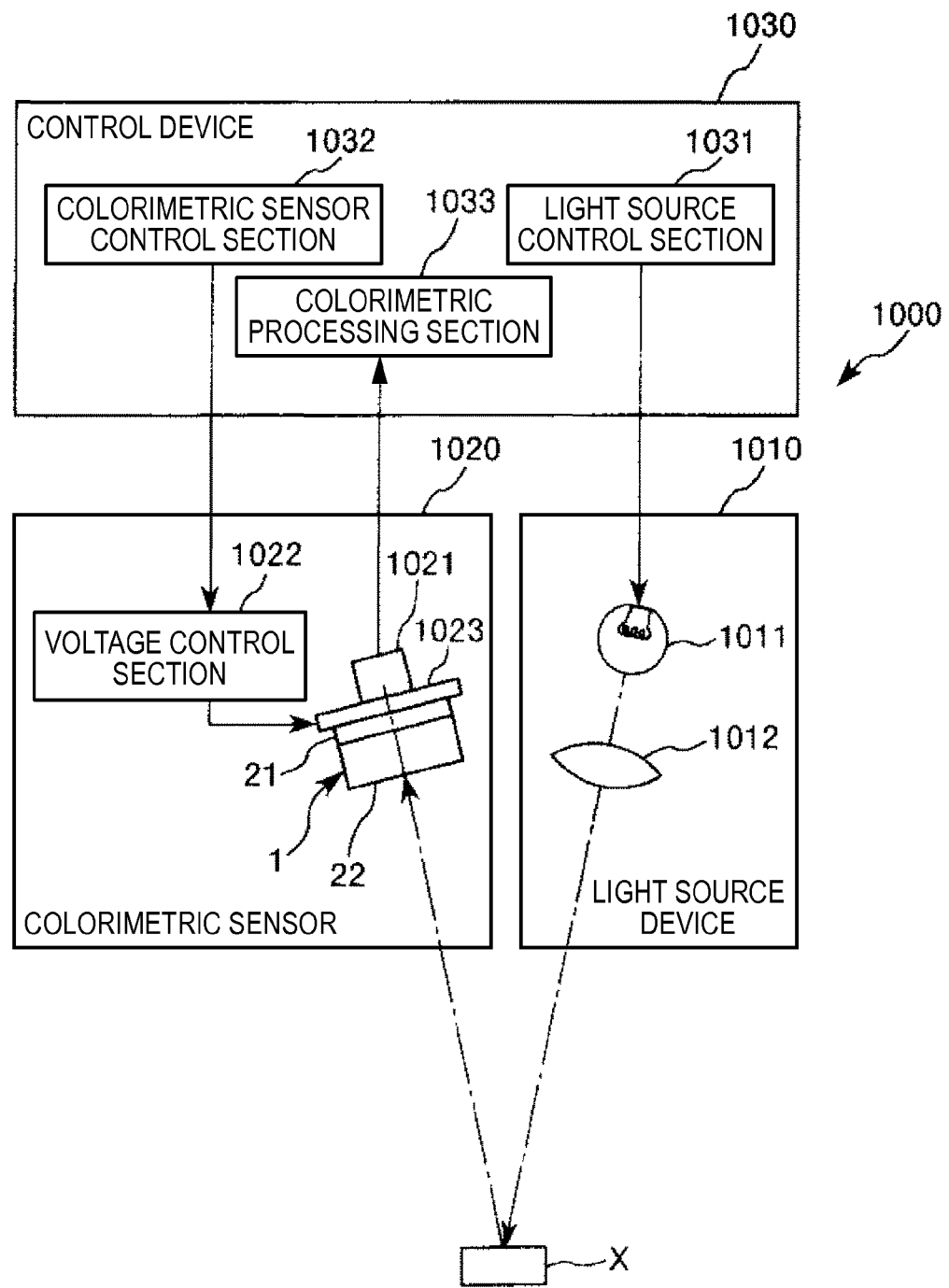
FIG. 11 is a block diagram showing a configuration of a colorimetric device to which the electronic apparatus according to the invention is applied.

FIG. 11 is a block diagram showing a configuration of a colorimetric device to which the electronic apparatus according to the invention is applied.

The colorimetric device 1000 shown in FIG. 11 is provided with a light source device 1010 for emitting light to a test object X, a colorimetric sensor 1020, and a control device 1030 for controlling an overall operation of the colorimetric device 1000. The colorimetric device 1000 is a device for making the light, which is emitted from the light source device 1010, be reflected by the test object X, receiving the test target light thus reflected using the colorimetric sensor 1020, and analyzing and then measuring the chromaticity of the test target light, namely the color of the test object X, based on the detection signal output from the colorimetric sensor 1020.

The light source device 1010 is provided with a light source 1011 and a plurality of lenses 1012 (it should be noted that one of the lenses is shown alone in FIG. 11), and emits a white light to the test object X. Further, it is possible for the plurality of lenses 1012 to include a collimator lens, and in this case, the light source device 1010 converts the white light emitted from the light source 1011 into a parallel light with the collimator lens, and emits it from the projection lens not shown toward the test object X. It should be noted that although in the present embodiment the colorimetric device 1000 provided with the light source device 1010 is described as an example, in the case in which, for example, the test object X is a light emitting member such as a liquid crystal panel, it is also possible to adopt a configuration not provided with the light source device 1010.

The colorimetric sensor 1020 is provided with the electronic device (the optical filter device) 1, a detection section 1021 for receiving the light transmitted through the variable wavelength interference filter 3 provided to the electronic device 1, and a voltage control section 1022 for varying the wavelength of the light to be transmitted through the variable wavelength interference filter 3. Further, the colorimetric sensor 1020 is provided with an entrance optical lens not shown disposed at a position opposed to the variable wavelength interference filter 3, the entrance optical lens guiding the reflected light (the test target light), which has been reflected by the test object X, into the inside thereof. Further, the colorimetric sensor 1020 disperses the light with a predetermined wavelength out of the test target light input from the entrance optical lens using the variable wavelength interference filter 3, and then receives the light thus dispersed using the detection section 1021.

The detection section 1021 is formed of a plurality of photoelectric conversion elements, and generates an electric signal corresponding to the received light intensity. Here, the detection section 1021 is connected to the control device 1030 via, for example, a circuit board 1023, and outputs the electric signal thus generated to the control device 1030 as a light reception signal. Further, the external terminal sections 216 formed on the base substrate 21 are connected to the circuit board 1023, and are connected to the voltage control section 1022 via a circuit provided to the circuit board 1023. In such a configuration, the electronic device 1 and the detection section 1021 can integrally be configured via the circuit board 1023, and thus the configuration of the colorimetric sensor 1020 can be simplified.

The voltage control section 1022 is connected to the external terminal sections 216 of the electronic device 1 via the circuit board 1023. Further, the voltage control section 1022 applies a predetermined step voltage between the stationary electrode pad 363P and the movable electrode pad 364P based on a control signal input from the control device 1030 to thereby drive the electrostatic actuator 36. Thus, the electrostatic attractive force is generated in the inter-electrode gap G2, the holding section 322 is deflected to thereby displace the movable section 321 toward the stationary substrate 31, and thus it becomes possible to set the inter-reflecting film gap G1 to the desired size.

The control device 1030 controls an overall operation of the colorimetric device 1000. As the control device 1030, a general-purpose personal computer, a handheld terminal, a colorimetry-dedicated computer, and so on can be used. Further, the control device 1030 includes alight source control section 1031, a colorimetric sensor control section 1032, and a colorimetric processing section 1033.

The light source control section 1031 is connected to the light source device 1010. Further, the light source control section 1031 outputs a predetermined control signal to the light source device 1010 based on, for example, a setting input by the user to thereby make the light source device 1010 emit a white light with a predetermined brightness.

The colorimetric sensor control section 1032 is connected to the colorimetric sensor 1020. Further, the colorimetric sensor control section 1032 sets the wavelength of the light to be received by the colorimetric sensor 1020 based on, for example, the setting input by the user, and then outputs the control signal, which instructs the detection of the intensity of the received light having the wavelength thus set, to the colorimetric sensor 1020. Thus, the voltage control section 1022 of the colorimetric sensor 1020 sets the voltage to be applied to the electrostatic actuator 36 based on the control signal so as to transmit only the light having the wavelength desired by the user.

The colorimetric processing section 1033 analyzes the chromaticity of the test object X based on the received light intensity detected by the detection section 1021.

According to such a colorimetric device 1000, the accurate color analysis of the test object X can be performed.

Gas Detection Device

Figure 12:
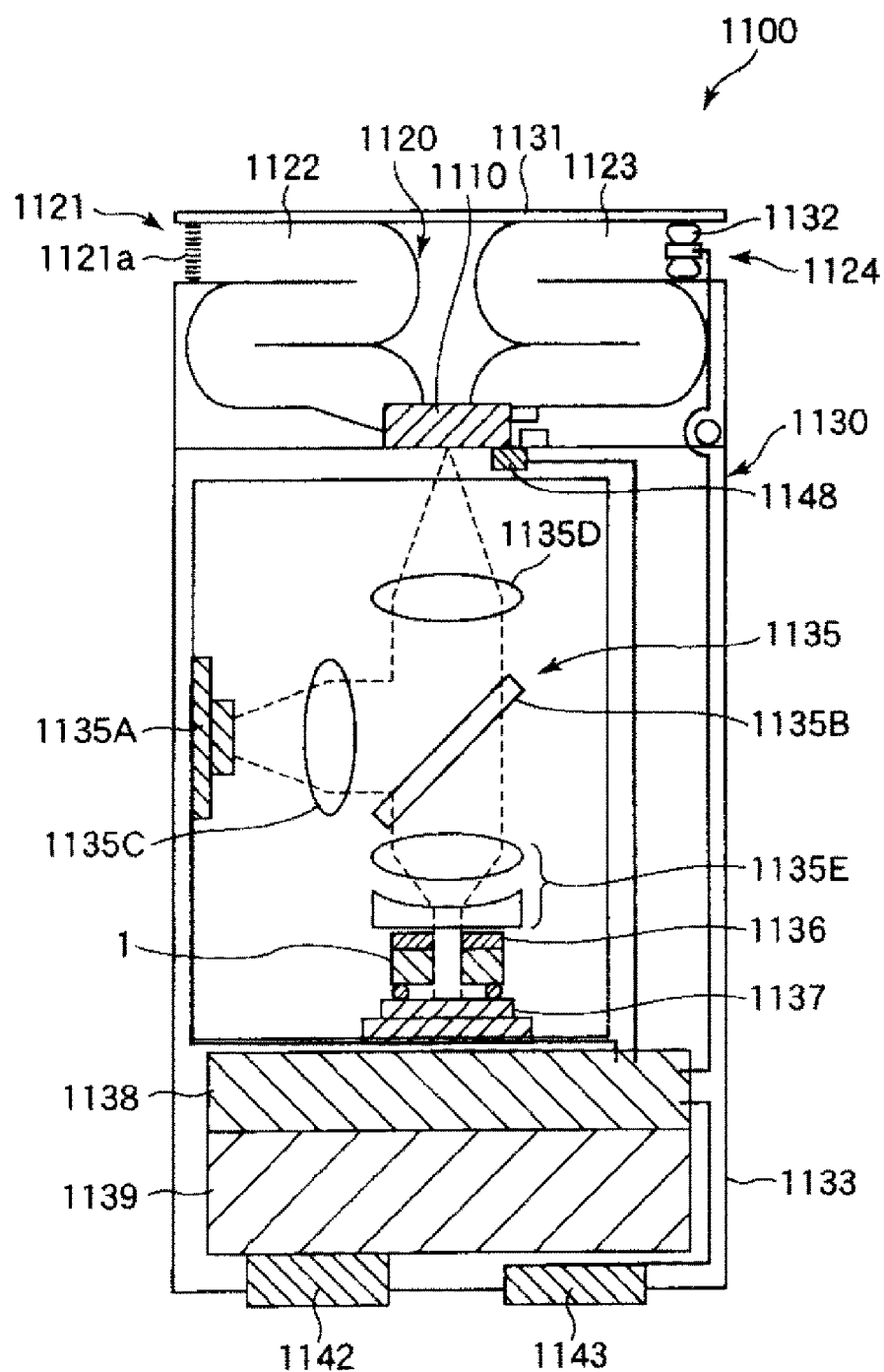
FIG. 12 is a diagram showing a configuration of a gas detection device to which the electronic apparatus according to the invention is applied.
Figure 13:
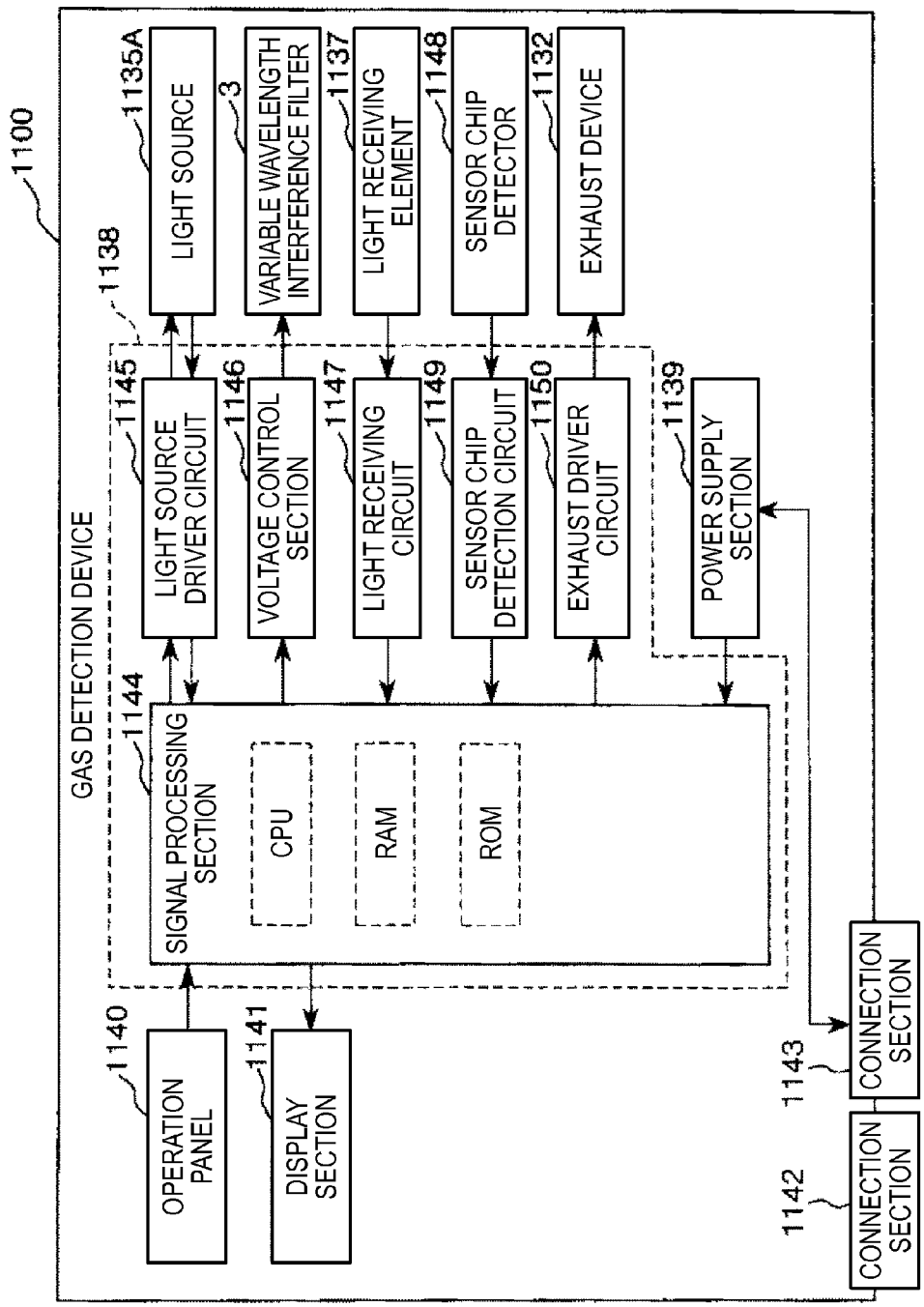
FIG. 13 is a block diagram showing a configuration of a control system of the gas detection device shown in FIG. 12.

FIG. 12 is a diagram showing a configuration of a gas detection device to which the electronic apparatus according to the invention is applied. FIG. 13 is a block diagram showing a configuration of a control system of the gas detection device shown in FIG. 12.

As shown in FIG. 12, a gas detection device 1100 is provided with a sensor chip 1110, a flow channel 1120, and a main body section 1130. Further, the flow channel 1120 is provided with a suction port 1121, a suction channel 1122, an exhaust channel 1123, and an exhaust port 1124.

The main body section 1130 is provided with a detection device, a control section 1138 for processing the signal thus detected and controlling the detection device, a power supply section 1139 for supplying the electric power. Further, the detection device includes a sensor section cover 1131 having an opening to which the flow channel 1120 can detachably be attached, an exhaust device 1132, a housing 1133, and optical section 1135, a filter 1136, an electronic device 1, and a light receiving element 1137. Further, the optical section 1135 includes alight source 1135A for emitting light, a beam splitter 1135B for reflecting the light, which is input from the light source 1135A, toward the sensor chip 1110, and transmitting the light, which is input from the sensor chip side, toward the light receiving element 1137, and lenses 1135C, 1135D, and 1135E.

Further, as shown in FIG. 13, on the surface of the gas detection device 1100, there are disposed an operation panel 1140, a display section 1141, a connection section 1142 for an interface with an external device, and the power supply section 1139. In the case in which the power supply section 1139 is a secondary battery, a connection section 1143 for the battery charge can also be provided.

Further, the control section 1138 of the gas detection device 1100 is provided with a signal processing section 1144 formed of a CPU and so on, a light source driver circuit 1145 for controlling the light source 1135A, a voltage control section 1146 for controlling the variable wavelength interference filter 3 of the electronic device (the optical filter device) 1, alight receiving circuit 1147 for receiving the signal from the light receiving element 1137, a sensor chip detection circuit 1149 for receiving a signal from a sensor chip detector 1148 for reading a code of a sensor chip 1110 and detecting the presence or absence of the sensor chip 1110, an exhaust driver circuit 1150 for controlling the exhaust device 1132, and so on.

Then, an operation of such a gas detection device 1100 as described above will be explained.

The sensor chip detector 1148 is disposed inside the sensor section cover 1131 in the upper part of the main body section 1130, and the sensor chip detector 1148 detects the presence or absence of the sensor chip 1110. When detecting the detection signal from the sensor chip detector 1148, the signal processing section 1144 determines that it is the condition in which the sensor chip 1110 is attached, and outputs a display signal for displaying the fact that the detection operation can be performed to the display section 1141. Then, in the case in which, for example, the user operates the operation panel 1140, and the operation panel 1140 outputs an instruction signal indicating that the detection process will be started to the signal processing section 1144, the signal processing section 1144 firstly outputs the signal for operating the light source to the light source driver circuit 1145 to thereby operate the light source 1135A. When the light source 1135A is driven, the light source 1135A emits a stable laser beam, which has a single wavelength and is a linearly polarized light. Further, the light source 1135A incorporates a temperature sensor and a light intensity sensor, and the information of the sensors is output to the signal processing section 1144.

Then, in the case in which the signal processing section 1144 determines that the light source 1135A is operating stably based on the information of the temperature and the light intensity input from the light source 1135A, the signal processing section 1144 controls the exhaust driver circuit 1150 to operate the exhaust device 1132. Thus, a gaseous sample including the target material (the gas molecule) to be detected is guided from the suction port 1121 to the suction channel 1122, the inside of the sensor chip 1110, the exhaust channel 1123, and the exhaust port 1124. It should be noted that the suction port 1121 is provided with a dust filter 1121a, and relatively large dust, some water vapor, and so on are removed.

Further, the sensor chip 1110 is a sensor incorporating a plurality of sets of metal nano-structures, and using localized surface plasmon resonance. In such a sensor chip 1110, an enhanced electric field is formed between the metal nano-structures due to the laser beam, and when the gas molecules enter the enhanced electric field, the Raman scattering light including the information of the molecular vibration, and the Rayleigh scattering light are generated.

The Rayleigh scattering light and the Raman scattering light pass through the optical section 1135 and then enter the filter 1136, and the Rayleigh scattering light is separated by the filter 1136, and the Raman scattering light enters the electronic device (the optical filter device) 1. Then, the signal processing section 1144 controls the voltage control section 1146 to control the voltage to be applied to the variable wavelength interference filter 3 of the electronic device 1 to thereby make the variable wavelength interference filter 3 disperse the Raman scattering light corresponding to the gas molecules to be the detection object. Subsequently, when the light thus dispersed is received by the light receiving element 1137, a light reception signal corresponding to the received light intensity is output to the signal processing section 1144 via the light receiving circuit 1147.

The signal processing section 1144 compares the spectrum data of the Raman scattering light corresponding to the gas molecule to be the detection object obtained in such a manner as described above and the data stored in the ROM with each other to thereby determine whether or not the gas molecule is the target one, and thus identifies the substance. Further, the signal processing section 1144 makes the display section 1141 display the result information, or outputs the result information from the connection section 1142 to an external device.

Food Analysis Device

As the system for detecting the presence of the specific substance, besides the gas detection described above, there can be cited a substance component analysis device such as a non-invasive measurement device of a sugar group using near-infrared dispersion, and a non-invasive measurement device of information of food, biological object, or mineral.

Hereinafter, a food analysis device will be explained as a representative example of the substance component analysis device.

Figure 14:
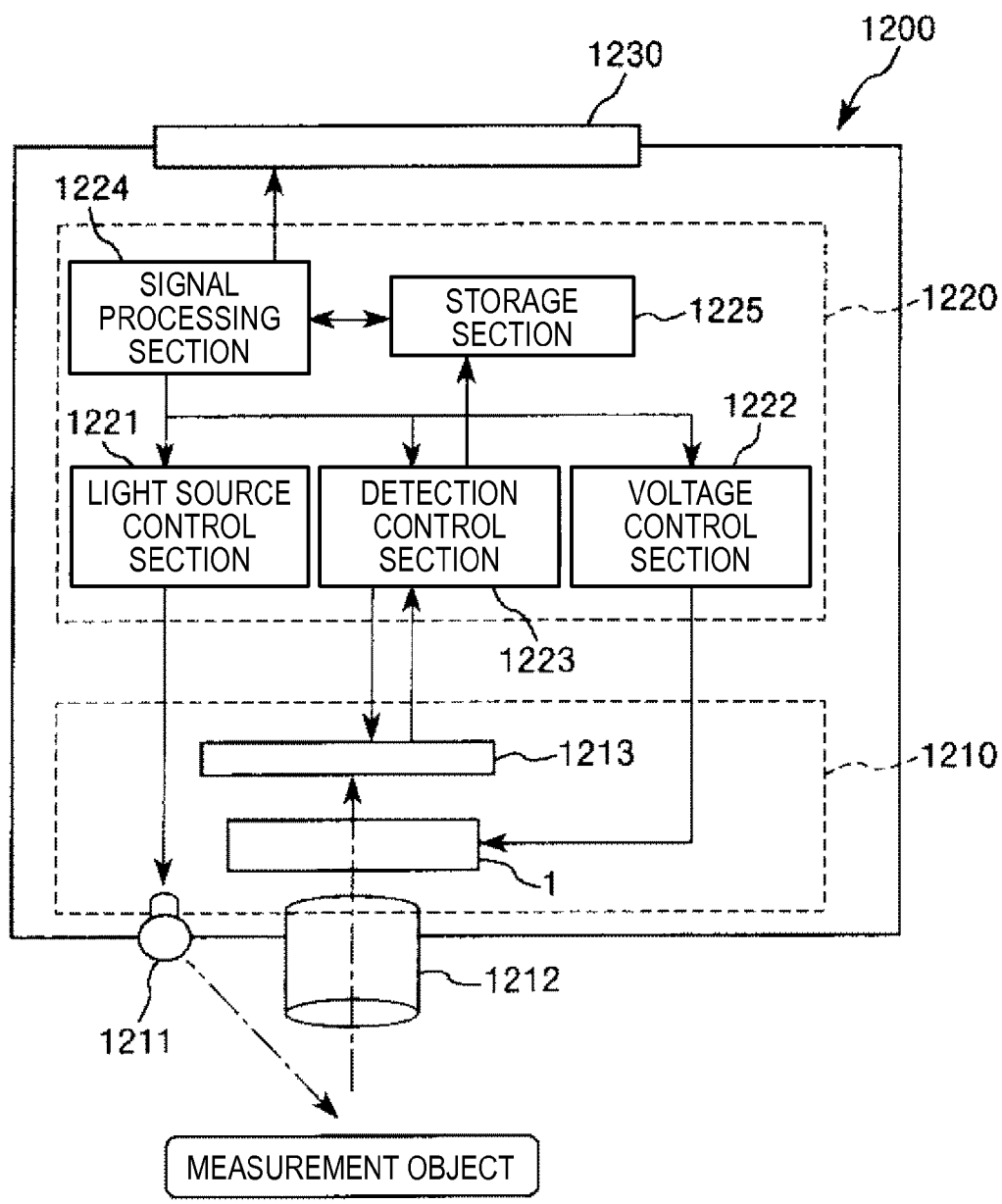
FIG. 14 is a diagram showing a configuration of a food analysis device to which the electronic apparatus according to the invention is applied.

FIG. 14 is a diagram showing a configuration of the food analysis device to which the electronic apparatus according to the invention is applied.

As shown in FIG. 14, the food analysis device 1200 is provided with a detector 1210, a control section 1220, and a display section 1230. The detector 1210 is provided with a light source 1211 for emitting light, an image pickup lens 1212 to which the light from a measurement object is introduced, the electronic device (the optical filter device) 1 for dispersing the light thus introduced from the image pickup lens 1212, and an image pickup section 1213 (a detection section) for detecting the light thus dispersed.

Further, the control section 1220 is provided with a light source control section 1221 for performing lighting/extinction control of the light source 1211 and brightness control in the lighting state, a voltage control section 1222 for controlling the variable wavelength interference filter 3, a detection control section 1223 for controlling the image pickup section 1213 and obtaining a spectral image taken by the image pickup section 1213, a signal processing section 1224, and a storage section 1225.

In the food analysis device 1200, when the system is driven, the light source control section 1221 controls the light source 1211, and the light source 1211 irradiates the measurement object with the light. Then, the light reflected by the measurement object passes through the image pickup lens 1212 and then enters the electronic device 1. The voltages with which the variable wavelength interference filter 3 can disperse the light into desired wavelengths are applied to the variable wavelength interference filter 3 under the control of the voltage control section 1222, and the light thus dispersed is picked up by the image pickup section 1213 formed of, for example, a CCD camera. Further, the light thus picked up is stored in the storage section 1225 as the spectral image. Further, the signal processing section 1224 controls the voltage control section 1222 to vary the voltage value to be applied to the variable wavelength interference filter 3 to thereby obtain the spectral image corresponding to each wavelength.

Then, the signal processing section 1224 performs an arithmetic process on the data of each pixel in each of the images stored in the storage section 1225 to thereby obtain the spectrum in each pixel. Further, the storage section 1225 stores, for example, information related to a component of food corresponding to the spectrum, and the signal processing section 1224 analyzes the data of the spectrum thus obtained based on the information related to the food stored in the storage section 1225, and then obtains the food component and the content thereof included in the detection object. Further, the calorie of the food, the freshness thereof, and so on can also be calculated based on the food component and the content thus obtained. Further, by analyzing the spectral distribution in the image, it is possible to perform extraction of the portion with low freshness in the food as a test object, and further, it is also possible to perform detection of a foreign matter and so on included in the food.

Then, the signal processing section 1224 performs a process of making the display section 1230 display the information of the components, the contents, the calorie, the freshness, and so on of the food as the test object obtained in such a manner as described above.

Further, although the example of the food analysis device 1200 is shown in FIG. 14, it is also possible to use substantially the same configuration as such a non-invasive measurement device of other information as described above.

For example, the configuration can be used as a biological analysis device for performing analysis of a biological component such as measurement and analysis of a biological fluid such as blood. If a device of detecting ethyl alcohol is cited as a device for measuring the biological fluid component such as blood, such a biological analysis device can be used as a device for detecting the influence of alcohol to the driver to thereby prevent driving under the influence of alcohol. Further, the configuration can also be used as an electronic endoscopic system equipped with such a biological analysis device. Further, it can also be used as a mineral analysis device for performing component analysis of minerals.

Spectroscopic Camera

Figure 15:
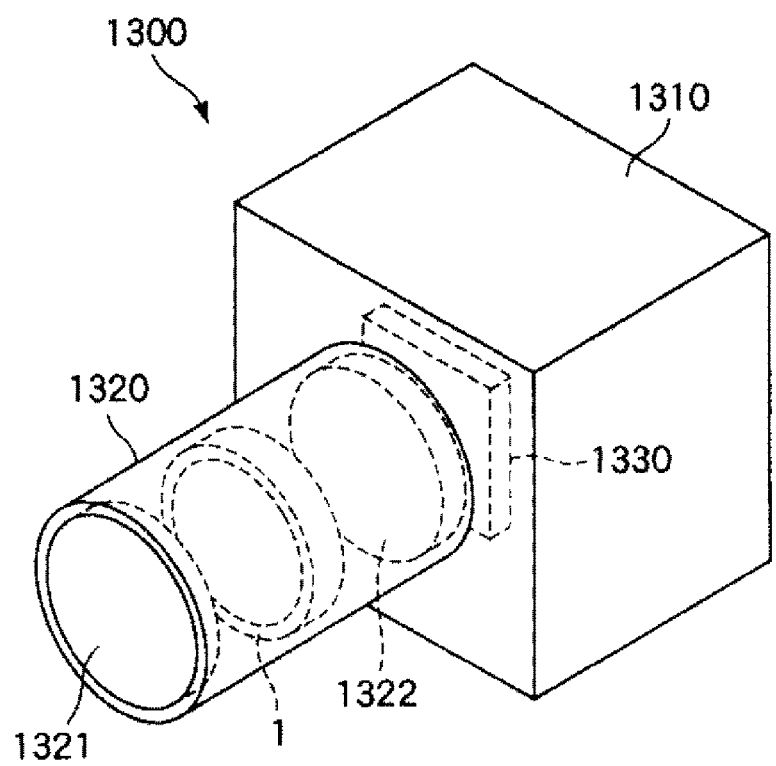
FIG. 15 is a diagram showing a configuration of a spectroscopic camera to which the electronic apparatus according to the invention is applied.

FIG. 15 is a diagram showing a configuration of a spectroscopic camera to which the electronic apparatus according to the invention is applied.

The spectroscopic camera 1300 shown in FIG. 15 is a camera for taking a spectral image by dispersing the light with the variable wavelength interference filter 3, and is an infrared camera incorporating the variable wavelength interference filter 3.

As shown in FIG. 15, the spectroscopic camera 1300 is provided with a camera main body 1310, an image pickup lens unit 1320, and an image pickup section 1330 (a detection section). The camera main boy 1310 is a part to be gripped and operated by the user. The image pickup lens unit 1320 is provided to the camera main body 1310, and guides the image light input thereto to the imaging section 1330. Further, the image pickup lens unit 1320 is configured including an objective lens 1321, an image forming lens 1322, and the electronic device (the optical filter device) 1 disposed between these lenses. The imaging section 1330 is formed of a light receiving element, and takes the image of the image light guided by the image pickup lens unit 1320.

In such a spectroscopic camera 1300, by transmitting the light with the wavelength to be the imaging object using the variable wavelength interference filter 3, the spectral image of the light with a desired wavelength can be taken.

Although the electronic apparatus incorporating the electronic device 1 is explained hereinabove citing some example, the electronic apparatus is not limited to the colorimetric device, the gas detection device, the food analysis device, and the spectroscopic camera.

For example, the electronic apparatus can also be used as an optical communication device. Specifically, by varying the intensity of the light having each wavelength with time using the electronic device 1, it is also possible to transfer data with the light having each wavelength. In this case, by dispersing the light with a specific wavelength using the variable wavelength interference filter provided to an optical module, and making the light receiving section receive the light, the data transferred with the light having the specific wavelength can be extracted, and by processing the data of the light with each wavelength, optical communication can also be performed.

Further, the electronic device 1 can also be used as a band-pass filter, and can also be used as, for example, an optical laser device for dispersing and transmitting only the light in a narrow band centered on a predetermined wavelength using the variable wavelength interference filter out of the light in a predetermined wavelength band emitted by the light emitting element.

Further, the electronic device according to the invention can be used as a biometric authentication device, and can be applied to, for example, an authentication device of blood vessels, a fingerprint, a retina, an iris, and so on using the light in a near infrared range or a visible range. Further, the electronic apparatus can be used as a concentration detection device. In this case, the infrared energy (the infrared light) emitted from the substance is dispersed by the electronic device 1 and is then analyzed, and the concentration of the test object in a sample is measured.

As described above, the electronic apparatus according to the invention can be applied to any device for dispersing predetermined light from the incident light. Further, since the electronic device 1 can disperse the light into a plurality of wavelengths with a single device as described above, the measurement of the spectrum of a plurality of wavelengths and detection of a plurality of components can be performed with accuracy. Therefore, compared to the related-art device of taking out desired wavelengths with a plurality of devices, miniaturization of the electronic apparatus can be promoted, and the electronic apparatus can preferably be used as, for example, a portable or in-car optical device.

Although the electronic device and the electronic apparatus according to the invention are described based on the embodiments shown in the accompanying drawings as described above, the invention is not limited to these embodiments, but the constituents of each of the sections can be replaced with those having an identical function and any configuration. Further, it is also possible to add any other constituents to the invention.

The entire disclosure of Japanese Patent Application No. 2013-248930, filed Dec. 2, 2013 is expressly incorporated by reference herein.

What is claimed is:

1. An electronic device comprising:
   a functional element; and
   a package adapted to house the functional element,
   wherein the package includes:
      a base substrate adapted to fix the functional element and provided with a light passage hole through which light passes,
      an external terminal formed on a surface of the base substrate that is opposite to the functional element, and
      a light transmissive substrate adapted to block the light passage hole and provided with a light transmissive property,
   the base substrate is formed of a laminated body having a plurality of layers stacked on each other,
   the light passage hole is formed so that a second opening located on an opposite side to the functional element is larger in area than a first opening located on the functional element side, and the light passage hole includes:
      a first light passage hole,
      a second passage hole located nearer to the second opening than the first light passage hole, and larger than the first light passage hole, and
      a step section provided to a connection section between the first light passage hole and the second light passage hole,
   wherein the light transmissive substrate is fixed to the base substrate via a bonding material provided to the step section,
   the step section has a tip portion curved toward the second opening, and
   a thickness of the bonding material gradually decreases toward the tip portion of the step section.

2. The electronic device according to claim 1, wherein the light transmissive substrate is located nearer to the second opening than the step section.

3. The electronic device according to claim 2, wherein the light transmissive substrate is located inside the second light passage hole, and has an outer edge portion located outside the first light passage hole in a planar view of the base substrate.

4. The electronic device according to claim 3, wherein the light transmissive substrate is at least partially located inside the second light passage hole.

5. The electronic device according to claim 4, wherein the light transmissive substrate is located between both principal surfaces of the base substrate in a cross-sectional view of the base substrate.

6. The electronic device according to claim 1, wherein the bonding material is located outside the first light passage hole in a planar view of the base substrate.

7. The electronic device according to claim 1, wherein the base substrate has a sealing hole adapted to seal an internal space of the package adapted to house the functional element.

8. The electronic device according to claim 1, wherein the functional element is an optical interference filter including
   a first substrate,
   a second substrate opposed to the first substrate,
   a first reflecting film provided to the first substrate, and
   a second reflecting film provided to the second substrate and opposed to the first reflecting film via an inter-reflecting film gap, and
having an optical interference region where the first reflecting film and the second reflecting film overlap each other, and
the light passage hole is disposed corresponding to the optical interference region.

9. An electronic apparatus comprising:
   a functional element; and
   a package adapted to house the functional element,
   wherein the package includes:
      a base substrate adapted to fix the functional element and provided with a light passage hole through which light passes,
      an external terminal formed on a surface of the base substrate that is opposite to the functional element, and
      a light transmissive substrate adapted to block the light passage hole and provided with a light transmissive property,
   the base substrate is formed of a laminated body having a plurality of layers stacked on each other, and
   the light passage hole is formed so that a second opening located on an opposite side to the functional element is larger in area than a first opening located on the functional element side, and the light passage hole includes:
      a first light passage hole,
      a second passage hole located nearer to the second opening than the first light passage hole, and larger than the first light passage hole, and
      a step section provided to a connection section between the first light passage hole and the second light passage hole,
   wherein the light transmissive substrate is fixed to the base substrate via a bonding material provided to the step section, the step section has a tip portion curved toward the second opening, and a thickness of the bonding material gradually decreases toward the tip portion of the step section.

* * * * *